United States Patent
Miyano

(10) Patent No.: US 8,106,695 B2
(45) Date of Patent: Jan. 31, 2012

(54) SEMICONDUCTOR DEVICE

(75) Inventor: Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/656,816

(22) Filed: Feb. 17, 2010

(65) Prior Publication Data

US 2010/0207675 A1   Aug. 19, 2010

(30) Foreign Application Priority Data

Feb. 19, 2009 (JP) .............................. P2009-036509

(51) Int. Cl.
*H03K 3/017* (2006.01)
(52) U.S. Cl. ........................................ 327/175; 327/172
(58) Field of Classification Search ........... 327/172–175
See application file for complete search history.

(56) References Cited

U.S. PATENT DOCUMENTS

| | | | | |
|---|---|---|---|---|
| 6,643,790 B1 * | 11/2003 | Yu et al. | .......................... | 713/500 |
| 7,199,634 B2 * | 4/2007 | Cho et al. | ....................... | 327/175 |
| 7,411,435 B2 * | 8/2008 | Monma et al. | ................. | 327/175 |
| 7,417,479 B2 | 8/2008 | Kitayama | | |
| 2009/0016127 A1 * | 1/2009 | Kuroki et al. | ................. | 365/194 |

FOREIGN PATENT DOCUMENTS

JP   2006-303553   11/2006

* cited by examiner

*Primary Examiner* — An Luu
(74) *Attorney, Agent, or Firm* — McGinn IP Law Group, PLLC

(57) ABSTRACT

A semiconductor device which has a duty detection circuit that detects a duty error in an internal clock synchronized with an external clock and is capable of performing accurate duty measurement. A first capacitor is coupled to a first node and a first current source coupled to a second node. A first switch is coupled between the first and second nodes. A second switch is coupled between a voltage line and the first node and a third switch is coupled between the voltage line and the second node, the third switch being rendered conductive while the second switch is in a conductive state. A second current source is coupled to a third node, with a fourth switch coupled between the first and the third nodes. A fifth switch is coupled between the voltage line and the third node, the fifth switch being rendered conductive while the second switch is in the conductive state.

9 Claims, 12 Drawing Sheets

SEMICONDUCTOR DEVICE

BACKGROUND OF THE INVENTION

1. Field of the Invention

The present invention relates to a semiconductor device which has a duty detection circuit that detects a duty error in an internal clock synchronized with an external clock. More particularly, the invention relates to a semiconductor device which has a duty detection circuit capable of performing accurate duty measurement.

Priority is claimed on Japanese Patent Application No. 2009-036509, filed Feb. 19, 2009, the content of which is incorporated herein by reference.

2. Description of the Related Art

Japanese Unexamined Patent Application, First Publication, No. JP-A-2006-303553 discloses a semiconductor memory device which has a duty detection circuit that detects a duty error in an internal clock synchronized with an external clock.

SUMMARY

In one embodiment, a device may include, but is not limited to, a first circuit unit, a first control circuit, a current source circuit, an initialization circuit, and a second control circuit. The first circuit unit performs a detecting operation to detect a ratio of a first time period in which an input signal takes a first logic level to a second time period in which the input signal takes a second logic level. The first circuit unit includes a storing unit and storing a detection result of a detection thereby to the storing unit thereof. The first control circuit controls the first circuit unit in response to the input signal. The current source circuit is coupled to the first control circuit at a first circuit node thereof. The initialization circuit performs an initializing operation to initialize the detection result of the storing unit of the first circuit unit. The second control circuit controls the first control circuit such that a voltage level of the first circuit node at a timing at which the initializing operation is terminated is equal to the voltage level of the first circuit node in the detecting operation following the initializing operation.

In another embodiment, a device may include, but is not limited to, a delay locked loop circuit which comprises a first duty detection circuit; a second duty detection circuit; and a duty adjustment circuit. The first duty detection circuit may include, but is not limited to, a first memory performing an integration of a ratio of a first time period in which an input signal takes a first logic level to a second time period in which the input signal takes a second logic level. The first memory stores a first result of the integration. The first duty detection circuit may include, but is not limited to, a first integration control circuit controlling integration operation of the first memory, in response to the input signal. The first duty detection circuit may include, but is not limited to, a first current circuit coupled to the first integration control circuit. The first duty detection circuit may include, but is not limited to, a first integration initialization circuit initializing the first result of the integration of the first memory. The first duty detection circuit allows the first integration control circuit to continue the integration operation of the first memory while the first integration initialization circuit is performing the initialization of the result of the integration of the first memory. The second duty detection circuit may include, but is not limited to, a second memory performing an integration of the ratio of the first time period to the second time period, the second memory storing a second result of the integration. The second duty detection circuit may include, but is not limited to, a second integration control circuit controlling integration operation of the second memory, in response to the input signal. The second duty detection circuit may include, but is not limited to, a second current circuit coupled to the second integration control circuit. The second duty detection circuit may include, but is not limited to, a second integration initialization circuit supplying an initializing potential to the second memory so as to initialize the second result of the integration of the second memory. The second duty detection circuit inhibits the second integration control circuit from performing the integration operation of the second memory and supplies the initializing potential to the second memory while the second integration initialization circuit is performing the initialization of the result of the integration of the second memory. The duty adjustment circuit adjusts the ratio of the first time period and the second time period, based in at least one of the first and second results.

In still another embodiment, a device may include, but is not limited to, a first capacitor, a second capacitor, a first control circuit, a first precharge circuit, a second control circuit. The first capacitor is coupled to a first power supply line at one end thereof. The second capacitor is coupled to a second power supply line at one end thereof. The first control circuit includes a first circuit unit and a second circuit unit. The first circuit unit is coupled to the other end of the first capacitor and the other end of the second capacitor, the second circuit unit coupled to the first circuit unit at a first circuit node thereof. The first circuit unit performs a first operation in which the first and second capacitors are charged or discharged through the second circuit unit in response to a clock signal. The first precharge circuit performs a first precharge operation in which voltage levels of the other ends of the first and second capacitors are set a predetermined precharge voltage level. The second control circuit terminates the first precharge operation and controls the first control circuit such that a voltage level of the first circuit node at a timing at which the first precharge operation is terminated is equal to the voltage level of the first circuit node in the first operation following the first precharge operation.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 11 and 12 and, in order to facilitate the understanding of the present invention.

Figure 11:
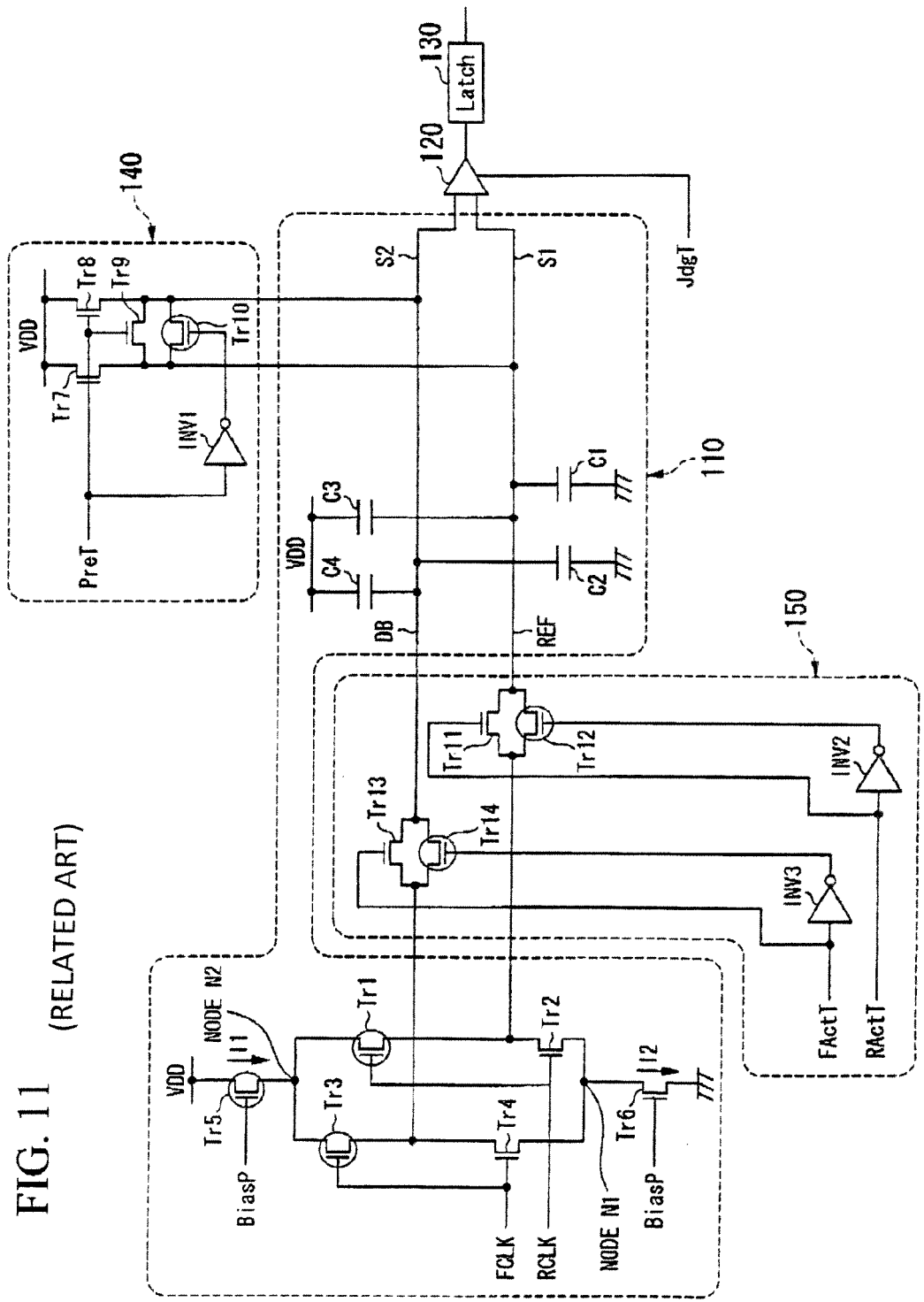
FIG. 11 is a block diagram illustrating the configuration of a duty detection circuit related to the art.

The duty detection circuit disclosed in JP-A-2006-303553 is shown in FIG. 11. In FIG. 11, nodes N1 and N2 are included in FIG. 1 of JP-A-2006-303553 in order to describe the problems with JP-A-2006-303553 discovered by the present inventor.

In the duty detection circuit of JP-A-2006-303553, when capacitors C1 to C4 are pre-charged (initialized) to a predetermined potential, the capacitors C1 to C4 (hereinafter referred to as a capacitor unit) are made to be electrically disconnected from integration transistors Tr1 to Tr4 and bias transistors Tr5 and Tr6 (hereinafter referred to as a charge and discharge unit) using activation transistors Tr11 to Tr14 (see FIG. 6 and Paragraph 0056 of JP-A-2006-303553).

The operation of electrically disconnecting the capacitor unit from the charge and discharge unit during the pre-charge period of the capacitor unit is necessary for initializing the potentials of the capacitors (C1 to C4) to a predetermined potential at the end of the pre-charge operation, namely at the start of a duty sampling period. However, the present inventor has discovered that when the capacitor unit is electrically disconnected from the charge and discharge unit during the pre-charge period of the capacitor unit as described in Japanese Unexamined Patent Application, First Publication, No. JP-A-2006-303553, it is difficult to measure the duty accurately.

Figure 12:
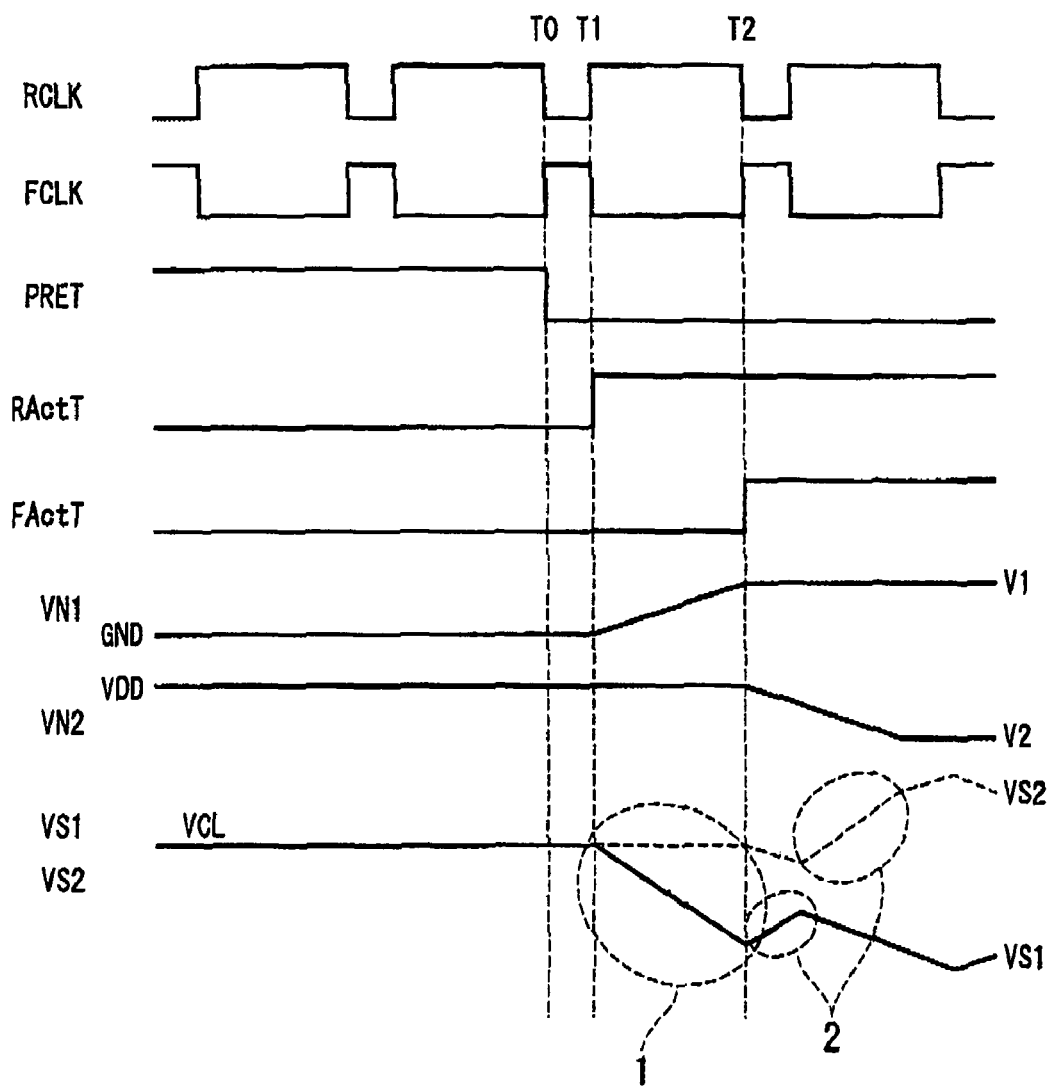
FIG. 12 is a timing chart illustrating waveforms showing inaccurate operations of the duty detection circuit of FIG. 11.

FIG. 12 is a diagram illustrating a case where the duty is not measured accurately. FIG. 12 is a waveform diagram showing the operations before and after a pre-charge operation of the circuit shown in FIG. 11 is performed.

Referring to FIGS. 11 and 12, the potential VN1 of a node N1 is at a ground potential (GND) during the pre-charge period (at times earlier than time T0) of the capacitors (C1 to C4). Moreover, the potential VN2 of a node N2 is at a power source potential (VDD) during the pre-charge period (at times earlier than time T0) of the capacitors (C1 to C4). This is because activation signals RActT and FActT are all inactive during the pre-charge period (at times earlier than time T0) of the capacitors (C1 to C4), namely the transistors Tr11 to Tr14 are all non-conductive, and thus the current path leading to the nodes N1 and N2 is blocked. As a result, the potential of the node N1 becomes equal to the potential of the GND connected thereto via the transistor Tr6, and the potential of the node N2 becomes equal to the potential of the VDD connected thereto via the transistor Tr5.

After that, when the pre-charge operation is completed (at time T0), the activation signal RActT becomes active, and a duty detection operation starts, the potential VN1 starts rising from GND to V1 (at time T1). Moreover, when the activation signal FActT becomes active, the potential VN2 starts falling from VDD to V2 (at time T2). Here, the potential VN1 of the node N1 is GND at the start (at time T1) of a discharge operation immediately after the end of the pre-charge operation. With progress of the discharge operation, the potential VN1 of the node N1 rises from GND to V1. At that time, since the potential of the node N1 rises from GND to V1 while a parasitic capacitor of the node N1 is charged, a discharge rate VS1 during the discharge operation immediately after the end of the pre-charge operation becomes higher than the discharge rate during a normal duty detection operation (see the circle marked 1 in FIG. 12).

Similarly, the potential VN2 of the node N2 is VDD at the start (at time T2) of a charge operation. With progress of the charge operation, the potential VN2 of the node N2 falls from VDD to V2.

At that time, since the potential of the node N2 falls from VDD to V2 while charges held in a parasitic capacitor of the node N2 are discharged, a charge rate VS2 during the charge operation immediately after the end of the pre-charge operation becomes higher than a charge rate during a normal duty detection operation (see the circle marked 2 in FIG. 12).

In the duty detection circuit disclosed in JP-A-2006-303553, by charging and discharging the capacitors (C1 to C4) at a constant charge/discharge rate, it is possible to detect an accurate duty ratio of a clock signal. However, as described above, when the charge/discharge rates of a capacitor are different between the time immediately after the pre-charge operation and the time during a normal duty detection operation, a charge/discharge operation after the pre-charge operation will become different from a charge/discharge operation during the duty detection operation (normal operation). As a result, there is a problem in that it is difficult to perform accurate duty detection.

As described above, in the duty detection circuit disclosed in JP-A-2006-303553, since the charge/discharge rates of the capacitor are different between the time immediately after the pre-charge operation and the time during a normal duty detection operation, the charge/discharge operation after the pre-charge operation becomes different from the charge/discharge operation during the duty detection operation (normal operation). As a result, there is a problem in that it is difficult to perform accurate duty detection.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a device may include, but is not limited to, a first circuit unit, a first control circuit, a current source circuit, an initialization circuit, and a second control circuit. The first circuit unit performs a detecting operation to detect a ratio of a first time period in which an input signal takes a first logic level to a second time period in which the input signal takes a second logic level. The first circuit unit includes a storing unit and storing a detection result of a detection thereby to the storing unit thereof. The first control circuit controls the first circuit unit in response to the input signal. The current source circuit is coupled to the first control circuit at a first circuit node thereof. The initialization circuit performs an initializing operation to initialize the detection result of the storing unit of the first circuit unit. The second control circuit controls the first control circuit such that a voltage level of the first circuit node at a timing at which the initializing operation is terminated is equal to the voltage level of the first circuit node in the detecting operation following the initializing operation.

In some cases, the second control circuit controls the first control circuit so that the voltage level of the first circuit node of the current source circuit is generally constant while the detecting operation of the first circuit is performed.

In some cases, the initialization circuit supplies an initializing potential to the storing unit of the first circuit unit. The second control circuit controls the first control circuit so as to connect the current source circuit and an initializing-potential supplying line while the initialization circuit is performing the initializing operation. The initializing-potential supplying line supplies the initializing potential.

In some cases, the second control circuit controls the first control circuit so that the voltage level of a first node of the current source circuit is generally constant while the initialization circuit is performing the initializing operation.

In some cases, the second control circuit controls the first control circuit so as to connect the current source circuit and the storing unit of the first circuit.

In some cases, the second control circuit controls activation and deactivation of the initializing operation, in a synchronous with the input signal.

In some cases, the storing unit may include, but is not limited to, a capacitor which discharges in the first time period and charges in the second time period. The detecting operation of the first circuit may include, but is not limited to, at least one of charge and discharge operations of the capacitor. The second control circuit controls the first control circuit so that the first circuit performs the detecting operation while the initialization circuit is performing the initializing operation.

The input signal may include, is not limited to, an internal clock signal. The internal clock signal takes the first logic level in the first time period. The internal clock signal takes the second logic level in the second time period. The storing unit may include, but is not limited to, first and second capacitors. The first capacitor discharges in the first time period and charging in the second time period. The second capacitor charges in the first time period and discharging in the second time period. The first control circuit may include, but is not limited to, a first integration transistor allowing the first capacitor to discharge in the first time period. The first control circuit may include, but is not Limited to, a second integration transistor allowing the first capacitor to charge in the second time period. The first control circuit may include, but is not limited to, a third integration transistor allowing the second capacitor to discharge in the second time period. The first control circuit may include, but is not limited to, a fourth integration transistor allowing the second capacitor to charge in the first time period. The current source circuit may include, but is not limited to, a first bias transistor having a first node coupled to the first and third integration transistors. The first bias transistor defines bias currents flowing through the first and third integration transistors so as to set discharge rates of the first and second capacitors, respectively. The first control circuit may include, but is not limited to, a second bias transistor having a second node coupled to the second and fourth integration transistors. The second bias transistor defines bias currents flowing through the second and fourth integration transistors so as to set charge rates of the first and second capacitors, respectively. Voltage levels of the first and second nodes are maintained generally constant while the first control circuit is controlling the detecting operation.

In some cases, the second control circuit controls the first control circuit so as to connect the current circuit to the storing unit through the initializing-potential supplying line while the initialization circuit is performing the initializing operation.

In some cases, the first control circuit may include, but is not limited to, a first integration circuit pre-charge transistor having a first electrode coupled to the initializing-potential supplying line. The first integration circuit pre-charge transistor has a second electrode coupled to the first circuit node of the current source circuit. The first integration circuit pre-charge transistor connects the initializing-potential supplying line to the current source circuit while the initialization circuit is performing the initializing operation. The first integration circuit pre-charge transistor disconnects the initializing-potential supplying line from the current circuit while the initialization circuit is not performing the initializing operation.

In some cases, the first control circuit may include, but is not limited to, a second integration circuit pre-charge transistor having a third electrode coupled to the initializing-potential supplying line. The second integration circuit pre-charge transistor has a fourth electrode coupled to the first circuit node of the current source circuit. The second integration circuit pre-charge transistor is different in conductivity type from the first integration circuit pre-charge transistor. The second control circuit supplies first and second control signals to control terminals of the first and second integration circuit pre-charge transistors respectively while the initialization circuit is not performing the initializing operation. The first control signal is synchronous with the input signal, the second control signal is opposite in phase to the first control signal.

In some cases, the current circuit may include, but is not limited to, a constant current circuit.

In another embodiment, a device may include, but is not limited to, a delay locked loop circuit which comprises a first duty detection circuit; a second duty detection circuit; and a duty adjustment circuit. The first duty detection circuit may include, but is not limited to, a first memory performing an integration of a ratio of a first time period in which an input signal takes a first logic level to a second time period in which the input signal takes a second logic level. The first memory stores a first result of the integration. The first duty detection circuit may include, but is not limited to, a first integration control circuit controlling integration operation of the first memory, in response to the input signal. The first duty detection circuit may include, but is not limited to, a first current circuit coupled to the first integration control circuit. The first duty detection circuit may include, but is not limited to, a first integration initialization circuit initializing the first result of the integration of the first memory. The first duty detection circuit allows the first integration control circuit to continue the integration operation of the first memory while the first integration initialization circuit is performing the initialization of the result of the integration of the first memory. The second duty detection circuit may include, but is not limited to, a second memory performing an integration of the ratio of the first time period to the second time period, the second memory storing a second result of the integration. The second duty detection circuit may include, but is not limited to, a second integration control circuit controlling integration operation of the second memory, in response to the input signal. The second duty detection circuit may include, but is not limited to, a second current circuit coupled to the second integration control circuit. The second duty detection circuit may include, but is not limited to, a second integration initialization circuit supplying an initializing potential to the second memory so as to initialize the second result of the integration of the second memory. The second duty detection circuit inhibits the second integration control circuit from performing the integration operation of the second memory and supplies the initializing potential to the second memory while the second integration initialization circuit is performing the initialization of the result of the integration of the second memory. The duty adjustment circuit adjusts the ratio of the first time period and the second time period, based in at least one of the first and second results.

In some cases, the first current circuit may include, but is not limited to, a first constant current circuit. The second current circuit may include, but is not limited to, a second constant current circuit. A second current flowing through the second constant current circuit is greater than a first current flowing through the first constant current circuit.

In some cases, the second duty circuit may include, but is not limited to, a first integration circuit pre-charge transistor having a first electrode coupled to an initializing-potential supplying line. The first integration circuit pre-charge transistor has a second electrode coupled to a first node of the second current circuit. The first integration circuit pre-charge transistor connects the initializing-potential supplying line to the second current circuit while the second integration initialization circuit is performing the initializing operation. The first integration circuit pre-charge transistor disconnects the initializing-potential supplying line from the second current circuit while the second integration initialization circuit is not performing the initializing operation.

In some cases, the device may further include, but is not limited to, a switch that receives the first and second results, the switch supplying a selected one of the first and second results to the duty adjustment circuit. The switch supplies the second result to the duty adjustment circuit in a transition time period in which the delay clocked loop circuit is transitioned from non-operation state to stably operation state. The switch supplies the first result to the duty adjustment circuit in a stable operation time period in which the delay clocked loop circuit is performing stable operation.

The second duty detection circuit is operable in the transition time period and inoperable in the stable operation time period.

In still another embodiment, a device may include, but is not limited to, a first capacitor, a second capacitor, a first control circuit, a first precharge circuit, a second control circuit. The first capacitor is coupled to a first power supply line at one end thereof. The second capacitor is coupled to a second power supply line at one end thereof. The first control circuit includes a first circuit unit and a second circuit unit. The first circuit unit is coupled to the other end of the first capacitor and the other end of the second capacitor, the second circuit unit coupled to the first circuit unit at a first circuit node thereof. The first circuit unit performs a first operation in which the first and second capacitors are charged or discharged through the second circuit unit in response to a clock signal. The first precharge circuit performs a first precharge operation in which voltage levels of the other ends of the first and second capacitors are set a predetermined precharge voltage level. The second control circuit terminates the first precharge operation and controls the first control circuit such that a voltage level of the first circuit node at a timing at which the first precharge operation is terminated is equal to the voltage level of the first circuit node in the first operation following the first precharge operation.

The second control circuit controls the first circuit unit such that the first circuit unit performs the first operation during a first period in which the precharge circuit performs the precharge operation.

The second circuit unit may include, but is not limited to, a second precharge circuit coupled to the first circuit node thereof. The second precharge circuit performs a second precharge operation in which voltage level of the first circuit node is set the predetermined precharge voltage level. The second control circuit controls the first and second precharge circuits such that the first precharge operation is performed substantially simultaneously to the second precharge operation.

First Embodiment

Figure 1:
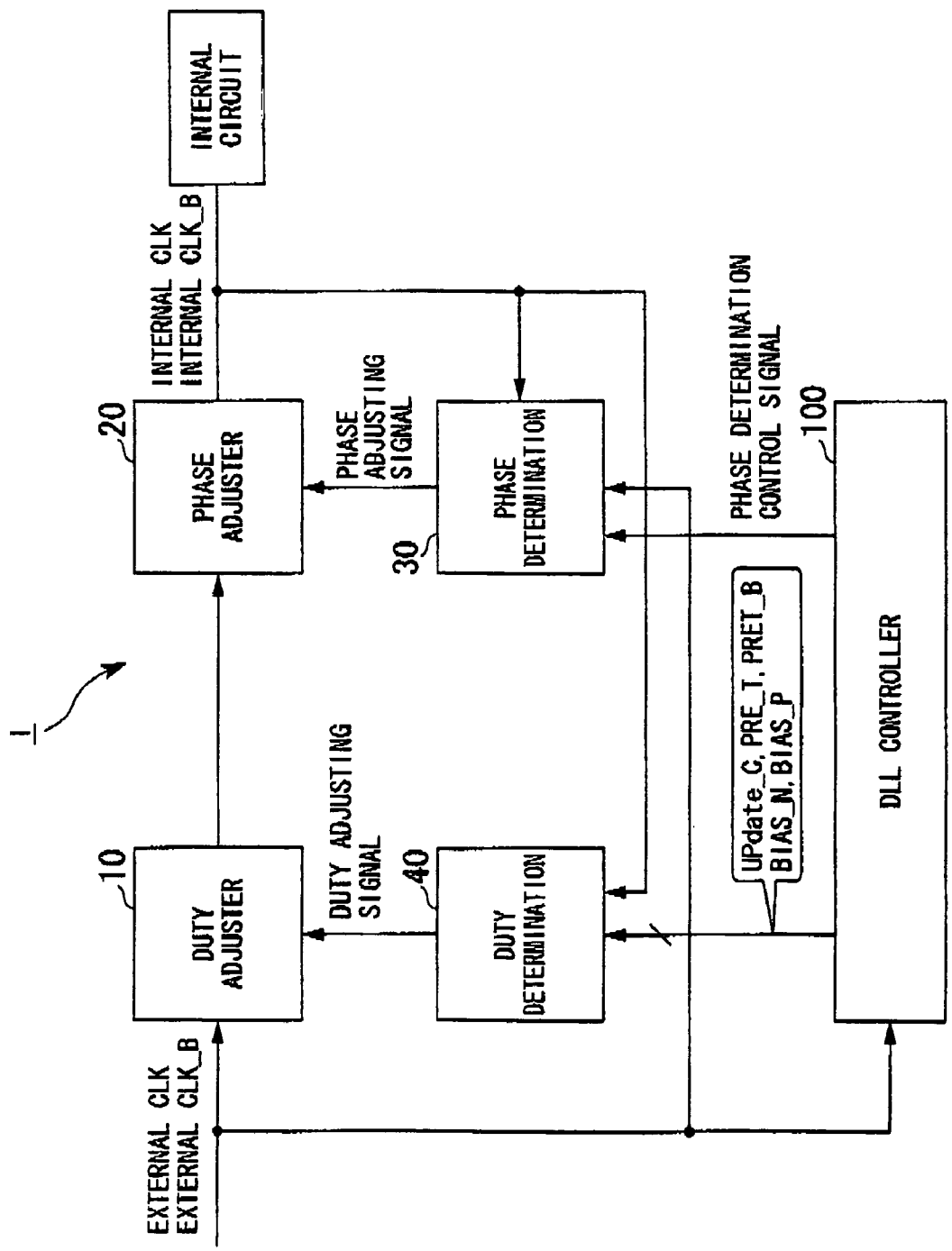
FIG. 1 is a block diagram illustrating the configuration of a delay clocked loop circuit in accordance with a first embodiment of the present invention.

FIG. 1 is a block diagram showing a configuration of a DLL (Delay Locked Loop) circuit having a duty detection circuit in a semiconductor device according to the invention.

A DLL circuit 1 shown in FIG. 1 includes a duty adjustment unit 10 that adjusts the duty of an external clock signal (external CLK, external CLK_B), a phase adjustment unit 20 that adjusts the phase of the external clock signal after duty adjustment and outputs an internal clock signal (internal CLK, internal CLK_B), a phase determination unit 30 that detects a phase difference between the internal clock signal and the external clock signal and outputs the result of phase difference detection to the phase adjustment unit 20 as a phase adjustment signal, a duty determination unit 40 that detects a duty of the internal clock signal and outputs the result of duty detection to the duty adjustment unit 10 as a duty adjustment signal, and a DLL control unit 100 that supplies a control signal to the phase determination unit 30 and the duty determination unit 40.

Figure 2:
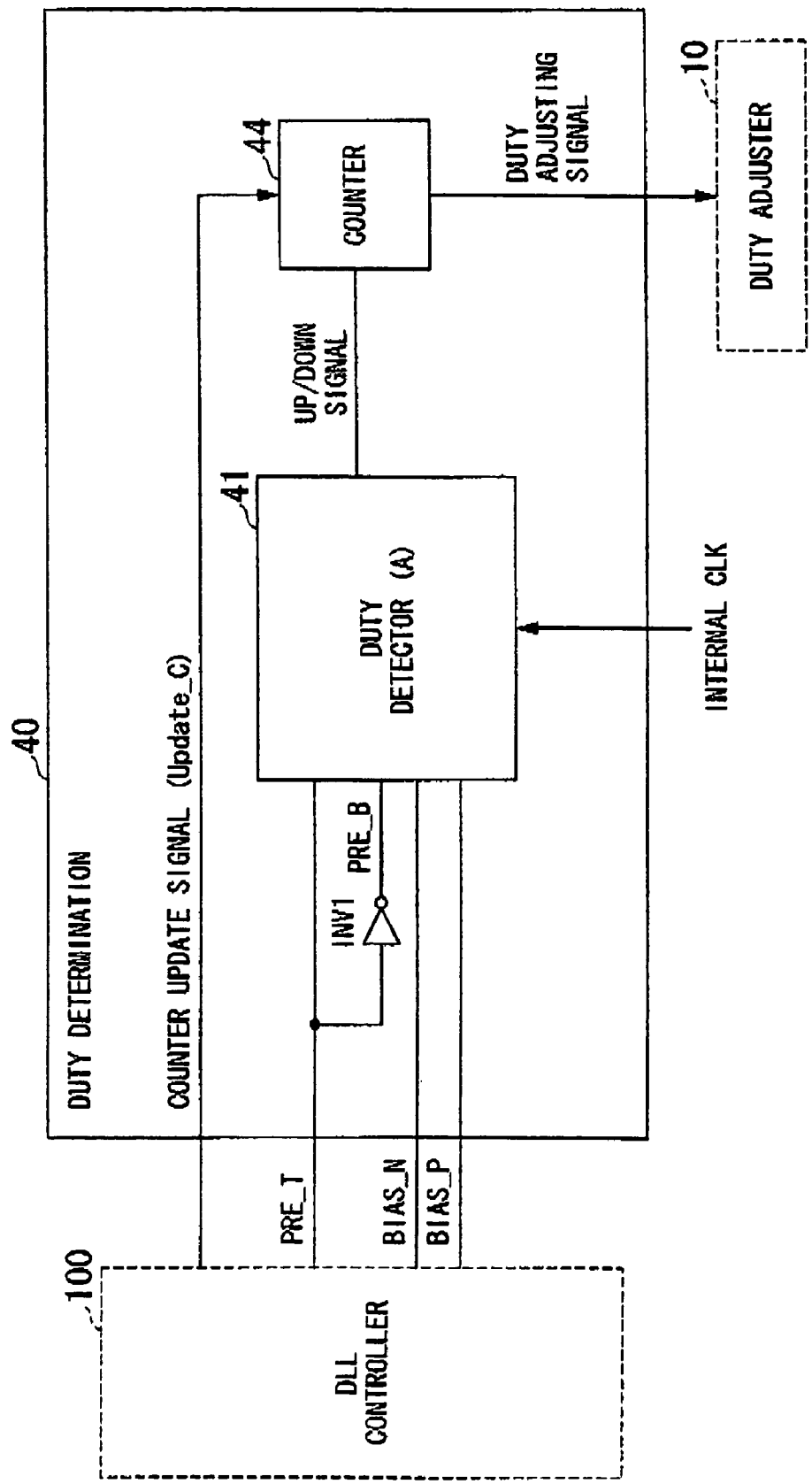
FIG. 2 is a block diagram illustrating the configuration of a duty determination unit included in the delay clocked loop circuit of FIG. 1.

FIG. 2 is a block diagram showing a configuration of a duty determination unit 40 shown in FIG. 1. As shown in FIG. 2, the duty determination unit 40 includes a duty detection circuit (A) 41 and a counter circuit 44.

The duty detection circuit (A) 41 is supplied with pre-charge signals PRE_T, PRE_B and bias signals BIAS_N, BIAS_P from the DLL control unit 100. Moreover, the counter circuit 44 is supplied with a counter update signal Update_C from the DLL, control unit 100 and an Up/Down signal from the duty detection circuit (A) 41. A detailed configuration of the duty detection circuit (A) 41 will be described later.

The counter circuit 44 changes a count value upon receiving an Up/Down signal supplied from the duty detection circuit (A) 41 and outputs a duty adjustment signal corresponding to the count value to the duty adjustment unit 10 in response to an activation of the counter update signal Update_C.

In the duty detection circuit (A) 41 according to the first embodiment, since a charge/discharge of capacitors C1 and C2 continues during a pre-charge period as described later, it is not necessary to synchronize a pre-charge signal and an activation signal with the internal clock signal so as to perform timing adjustment unlike the above-described circuit (see FIG. 11) disclosed in JP-A-2006-303553. For this reason, it is not necessary to provide a duty detection control circuit (synchronization circuit) for synchronizing the respective control signals with the internal clock signal. Since this duty detection control circuit (synchronization circuit) is a circuit in which power consumption is large, the duty detection circuit (A) 41 according to the first embodiment is able to achieve lower power consumption than the duty detection circuit disclosed in JP-A-2006-303553.

Figure 3:
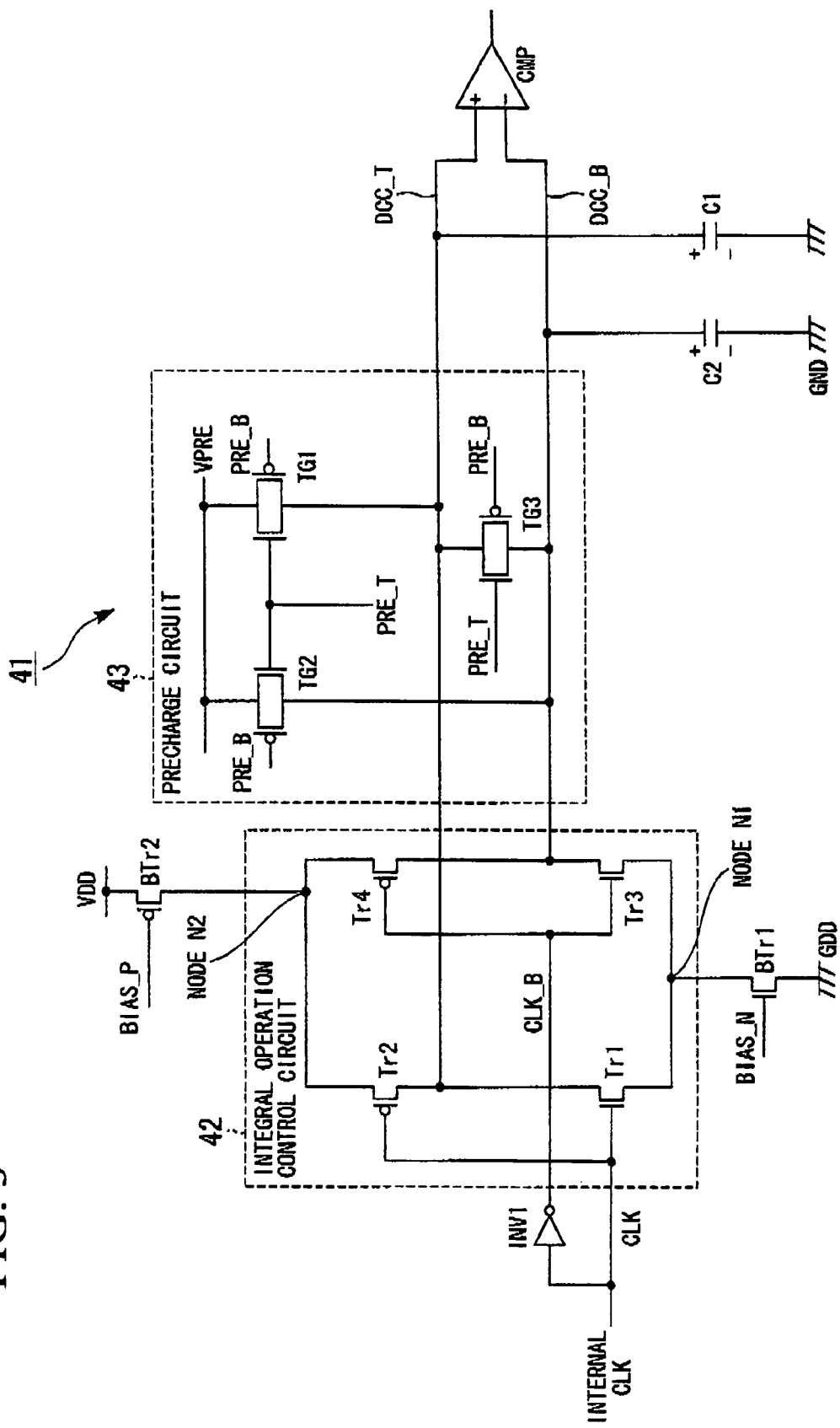
FIG. 3 is a circuit diagram illustrating a duty detection circuit included in the duty determination unit of FIG. 2.

FIG. 3 is a circuit diagram of the duty detection circuit (A) 41 according to the first embodiment.

The duty detection circuit (A) 41 according to the first embodiment includes capacitors C1 and C2 which are storage units, an integration operation control circuit 42 that controls a charge/discharge operation of the capacitors C1 and C2, a first bias transistor BTr1 which is disposed between the integration operation control circuit 42 and the ground GND and has a control terminal being supplied with a bias signal BIAS_N, a second bias transistor BTr2 which is disposed between the integration operation control circuit 42 and a power source VDD and has a control terminal being supplied with a bias signal BIAS_P, a pre-charge circuit 43 that performs a pre-charge operation of the capacitors C1 and C2, a comparison circuit CMP that compares potential of a signal line DCC_T connected to the capacitor C1 with potential of a signal line DCC_B connected to the capacitor C2 and supplies an Up/Down signal to the counter circuit 44 shown in FIG. 2.

Here, the charge/discharge operation of the capacitors C1 and C2 corresponds to an integration operation, the pre-charge operation of the capacitors C1 and C2 corresponds to an integration initialization operation, the integration operation control circuit 42 corresponds to a first control circuit (integration control circuit), a second control circuit corresponds to the DLL control unit 100, the pre-charge circuit 43 corresponds to an integration initialization circuit. Moreover, the first bias transistor BTr1 or the second bias transistor BTr2 corresponds to a current circuit (or constant current circuit), and a second power line corresponds to a power line of a pre-charge power source PRE.

The capacitor C1 has one end connected to the signal line DCC_T and the other end connected to the ground GND. Moreover, the capacitor C2 has one end connected to the signal line DCC_B and the other end connected to the ground GND. Furthermore, the capacitors C1 and C2 have recorded therein the results of integration of the ratio (duty ratio) of a high-level (first logic level) period to a low-level (second logic level) period of the internal CLK.

Specifically, the capacitor C1 is discharged during a high-level period of the internal CLK and charged during a low-level period of the internal CLK. On the other hand, the capacitor C2 is charged during the low-level period of the internal CLK and discharged during the high-level period of the internal CLK. In this way, since the capacitors C1 and C2 are charged and discharged in a complementary manner, even when there is variation in the amounts of charge charged and discharged by the integration control circuit (integration operation control circuit 42), it is possible to cancel the variation in the amounts of charge charged and discharged by the integration control circuit (integration operation control circuit 42) by comparing the potentials of the capacitors C1 and C2 with each other with the comparison circuit CMP described later and detecting a duty ratio.

Moreover, the first bias transistor BTr1 is an N-channel MOS transistor (NMOS transistor) of a first conduction type, and the second bias transistor BTr2 is a P-channel MOS transistor (PMOS transistor) of a second conduction type.

The first bias transistor BTr1 is a constant current circuit that maintains the amount of current (bias current) being discharged from the integration operation control circuit 42 to the ground GND to be constant. Moreover, the second bias transistor BTr2 is a constant current circuit that maintains the amount of current (bias current) being supplied from the power source VDD to the integration operation control circuit 42 to be constant. That is, by defining the bias current flowing to the first bias transistor BTr1, a discharge rate from the capacitors C1 and C2 is set. Moreover, by defining the bias current flowing to the second bias transistor BTr2, a charge rate to the capacitors C1 and C2 is set.

The integration operation control circuit 42 includes first and second integration transistors Tr1 and Tr2 that perform switching operations in response to a clock signal (CLK) and third and fourth integration transistors Tr3 and Tr4 that perform switching operations in response to an inverted clock signal (CLK_B) supplied from an inverter INV1. Here, the first and third integration transistors Tr1 and Tr3 are NMOS transistors, and the second and fourth integration transistors Tr2 and Tr4 are PMOS transistors.

The first bias transistor BTr1 is connected in common to one primary electrode (source in FIG. 3) of the first integration transistor Tr1 and one primary electrode (source in FIG. 3) of the third integration transistor Tr3 via a node N1. Moreover, the second bias transistor BTr2 is connected in common to one primary electrode (source in FIG. 3) of the second integration transistor Tr2 and one primary electrode (source in FIG. 3) of the fourth integration transistor Tr4 via a node N2.

The pre-charge circuit 43 includes a transfer gate TG1 which has one end connected to the power line VDD and the other end connected to the signal line DCC_T, a transfer gate TG2 which similarly has one end connected to the power line VDD and the other end connected to the signal line DCC_B, and a transfer gate TG3 which has one end connected to the signal line DCC_T and the other end connected to the signal line DCC_B.

The transfer gates TG1, TG2, and TG3 become conductive when the pre-charge signals PRE_T and PRE_B supplied from the DLL control unit 100 become active, namely when the pre-charge signal PRE_T becomes high level and the pre-charge signal PRE_B becomes low level, thus performing a pre-charge operation of the capacitors C1 and C2. Moreover, the transfer gates TG1, TG2, and TG3 become non-conductive when the pre-charge signals PRE_T and PRE_B become inactive, namely when the pre-charge signal PRE_T becomes low level and the pre-charge signal PRE_B becomes high level, thus ending the pre-charge operation of the capacitors C1 and C2. The comparison circuit CMP compares the potentials of the signal line DCC_T and the signal line DCC_B with each other and outputs the result of this comparison to the counter circuit 44 as the Up/Down signal.

Next, the operation of the duty detection circuit (A) 41 according to the first embodiment will be described with reference to FIG. 4.

Figure 4:
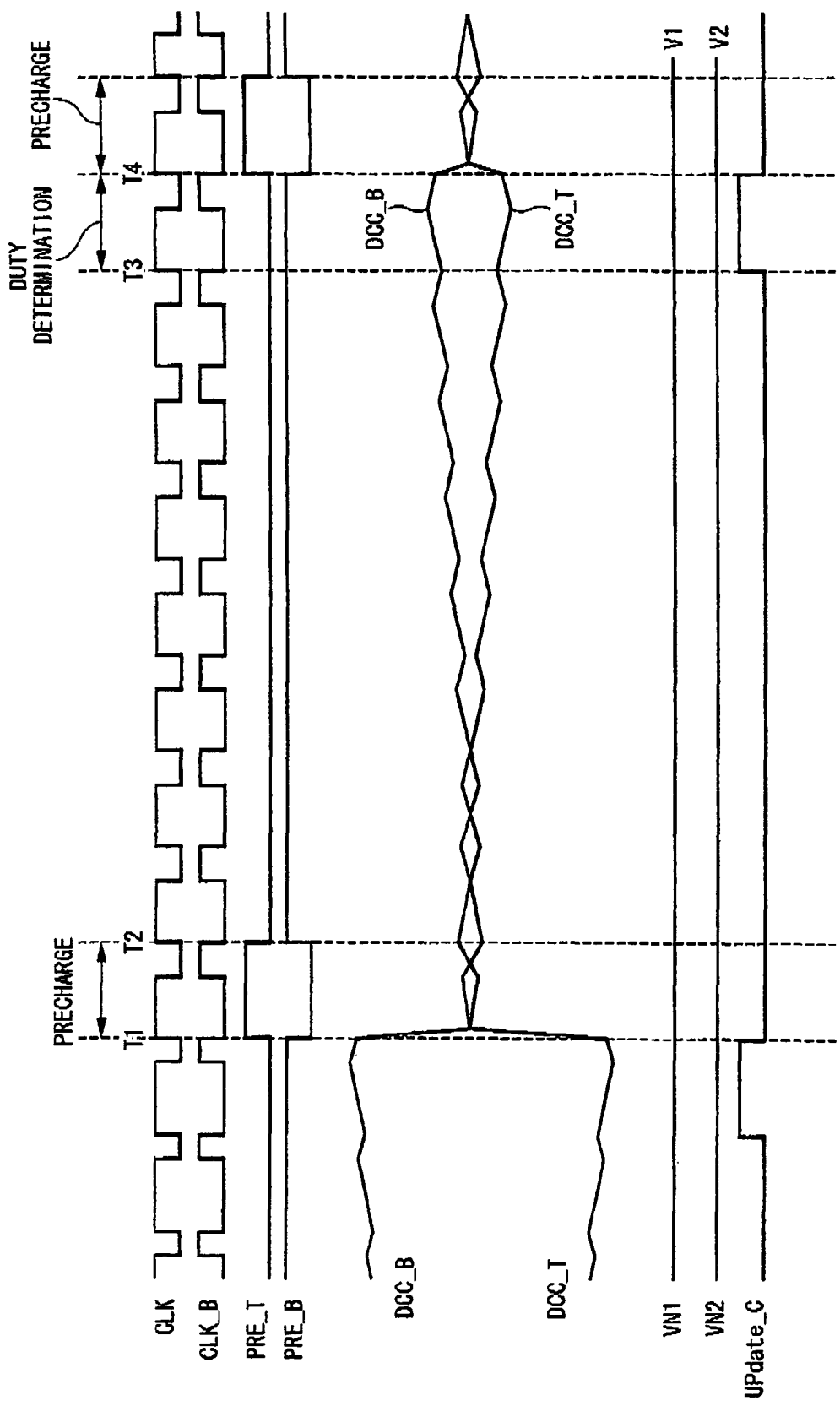
FIG. 4 is a timing chart illustrating waveforms showing operations of the duty detection circuit of FIG. 3.

Referring to FIG. 4, when the pre-charge signals PRE_T and PRE_B become active at time T2, the transfer gates TG1, TG2, and TG3 shown in FIG. 3 become conductive, and the pre-charge operation of the signal line DCC_T and the signal line DCC_B, namely the pre-charge operation of the capacitor C2 and the capacitor C2 is started.

Specifically, the signal line DCC_T (and the capacitor C1) which is charged at times earlier than time T1 at potential corresponding to an integration value during the high-level period of the internal clock signal CLK and the signal line DCC_B (and the capacitor C2) which is charged at times earlier than time T1 at potential corresponding to an integration value during the low-level period of the internal clock signal CLK are pre-charged to a predetermined pre-charge potential (VDD/2 in FIG. 4).

When the pre-charge signals PRE_T and PRE_B become inactive at time T2, the transfer gates TG1, TG2, and TG3 become non-conductive, and the pre-charge operation of the signal line DCC_T and the signal line DCC_B, namely the pre-charge operation of the capacitor C1 and the capacitor C2 ends.

At time T3, a pulse signal of the counter update signal Update_C from the DLL control unit 100 is supplied to the counter circuit 44. In response to an activation of the counter update signal Update_C, the counter circuit 44 changes a count value in accordance with the Up/Down signal from the comparison circuit CMP and outputs a duty adjustment signal to the duty adjustment unit 10.

At time T4, by the control of the integration operation control circuit 42 shown in FIG. 3, the capacitor C1 and the capacitor C2 perform an integration operation (charge/discharge operation of capacitors) based on the duty ratios of the internal clock signals CLK and CLK_B, respectively, until the pre-charge signals PRE_T and PRE_B become active again.

Specifically, the integration operation control circuit 42 discharges the electric charges from the capacitor C1 to the ground GND and charges the electric charges from the power source VDD to the capacitor C2 when the internal clock signal CLK becomes high level which is a first logic level. Moreover, the integration operation control circuit 42 charges the electric charges from the power source VDD to the capacitor C1 and discharges the electric charges from the capacitor C2 to the ground GND when the internal clock signal CLK becomes low level which is a second logic level. As described above, by repeating the charge/discharge operation of the capacitors, the capacitor C1 and the capacitor C2 are respectively at potentials reflecting the results of integration of the ratio of the high-level period and the low-level period of the internal clock signal CLK.

Since the charge/discharge operation of the capacitors C1 and C2 by the integration operation control circuit 42 is continued during the execution of the pre-charge operation (times T1 to T2), the potentials of the capacitors C1 and C2 vary during the pre-charge period.

The potential VN1 of the node N1 has approximately the same potential (V1) between time (times T1 to T2) during the execution of the pre-charge operation and the time (times T2 to T3, for example) when the pre-charge operation is not performed. Similarly, the potential VN2 of the node N2 has approximately the same potential (V2) between time (times T1 to T2) during the execution of the pm-charge operation and the time (times T2 to 11, for example) when the pre-charge operation is not performed.

Since the potentials of the nodes N1 and N2 have approximately the same potentials between time (times T1 to T2) during the execution of the pre-charge operation and the time (times T2 to T3, for example) when the pre-charge operation is not performed, there will be no change in the charge/discharge rate due to charging of a parasitic capacitor of the node N1 and discharging from a parasitic capacitor of the node N2 immediately after the end of the pre-charge operation. For this reason, the charge/discharge rate of a capacitor immediately after the pre-charge operation will be approximately the same as the charge/discharge rate of a capacitor during the execution of a duty detection operation in a normal state. Therefore, in the duty detection circuit according to the embodiment, there is no unbalance between the charge/discharge rate of a capacitor immediately after the pre-charge operation and the charge/discharge rate of a capacitor during the execution of a duty detection operation in a normal state. As a result, it is possible to perform accurate duty measurement.

Although the first embodiment of the present invention has been described, the duty detection circuit (A) 41 shown in FIG. 3 is configured to include a memory unit (capacitors C1 and C2) that integrates the ratio of a first logic level (high level) period to a second logic level (low level) period of an input signal (CLK and CLK_B) and electrically stores the result of the integration as an integration result, a first control circuit (integration operation control circuit 42) that controls an integration operation of the memory unit in response to the input signal, a current circuit (bias transistors BTr1 and BTr2) which has one end connected to the first control circuit (integration operation control circuit 42) and the other end connected to a power line (VDD and GND), an integration initialization circuit (pre-charge circuit 43) that initializes the integration result of the memory unit, and a second control circuit (DLL control unit 100) that controls the first control circuit (integration operation control circuit 42) so that current flows towards the current circuit (bias transistors BTr1 and BTr2) during execution of an integration initialization operation (pre-charge) by the integration initialization circuit (pre-charge circuit 43). In this case, it is preferable that the current circuit (bias transistors BTr1 and BTr2) is configured by a constant current circuit.

Moreover, the second control circuit (DLL control unit 100) controls the first control circuit (integration operation control circuit 42) so that the potential of the one end (node N1 or N2) of the current circuit (bias transistors BTr1 and BTr2) becomes approximately constant during execution of the integration operation. Furthermore, the second control circuit (DLL control unit 100) controls the first control circuit (integration operation control circuit 42) so that the potential of the one end (node N1 or N2) of the current circuit (bias transistors BTr1 and BTr2) at the end of the integration initialization operation (pre-charge) becomes approximately the same as the potential of the one end (node N1 or N2) of the current circuit (bias transistors BTr1 and BTr2) during execution of the integration operation by the first control circuit (integration operation control circuit 42).

For example, the integration operation on the memory unit (capacitors C1 and C2) by the integration control circuit (integration operation control circuit 42) is continued during execution of an initialization operation (pre-charge) of an integration value of the memory unit (capacitors C1 and C2) by the integration initialization circuit (pre-charge circuit 43). With this configuration, the potential of contact points (nodes N1 and N2) between the integration control circuit (integration operation control circuit 42) and the constant current circuit (bias transistors BTr1 and BTr2) become approximately the same between time during the initialization operation period (pre-charge period) and time during the duty detection operation period. For this reason, in the duty detection circuit of the semiconductor device according to the embodiment, there is no unbalance between the charge/discharge rate of the memory unit (capacitors C1 and C2) immediately after the pre-charge operation and the charge/discharge rate of the memory unit (capacitors C1 and C2) during the execution of the duty detection operation in a normal state. As a result, it is possible to perform accurate duty measurement.

Second Embodiment

To perform duty detection more accurately, it is necessary to make the potentials of the capacitors C1 and C2 at the start of the duty detection operation (at the end of the pre-charge operation) exactly the same and perform the duty detection operation for the same period. However, in the duty detection circuit described in the first embodiment, since the charge/discharge operation of the capacitors C1 and C2 is continued during execution of the pre-charge operation, it is difficult to make the potentials of the capacitors C1 and C2 at the start of the duty detection operation exactly the same. For this reason, in the duty detection circuit (A) 41 according to the first embodiment, in order to reduce the effect of the inability to make the potentials of the capacitors C1 and C2 at the start of the duty detection operation exactly the same, current driving capability (the amount of bias current) of the bias transistors BTr1 and BTr2 is lower than that of the conventional duty detection circuit so as to decrease the potential difference between the capacitors C1 and C2 at the start of the duty detection operation by the charge/discharge operation during the pre-charge period.

However, for accurate determination of the duty detection result, it is necessary to have a large extent of potential difference between the capacitors C1 and C2 during the duty determination. As described above, however, in the duty detection circuit according to the first embodiment, the current driving capability (the amount of bias current) of the bias transistors BTr1 and BTr2 is lower than that of the conventional duty detection circuit. For this reason, in order to make the potential difference between the capacitors C1 and C2 during the duty determination substantially the same as that of the conventional duty detection circuit, it is necessary to perform the duty detection operation for a longer period of time than the conventional duty detection period. Therefore, in the duty detection circuit described in the first embodiment, it is difficult to perform accurate duty detection in a short period of time.

A duty detection circuit according to the second embodiment aims to solve this problem.

Figure 5:
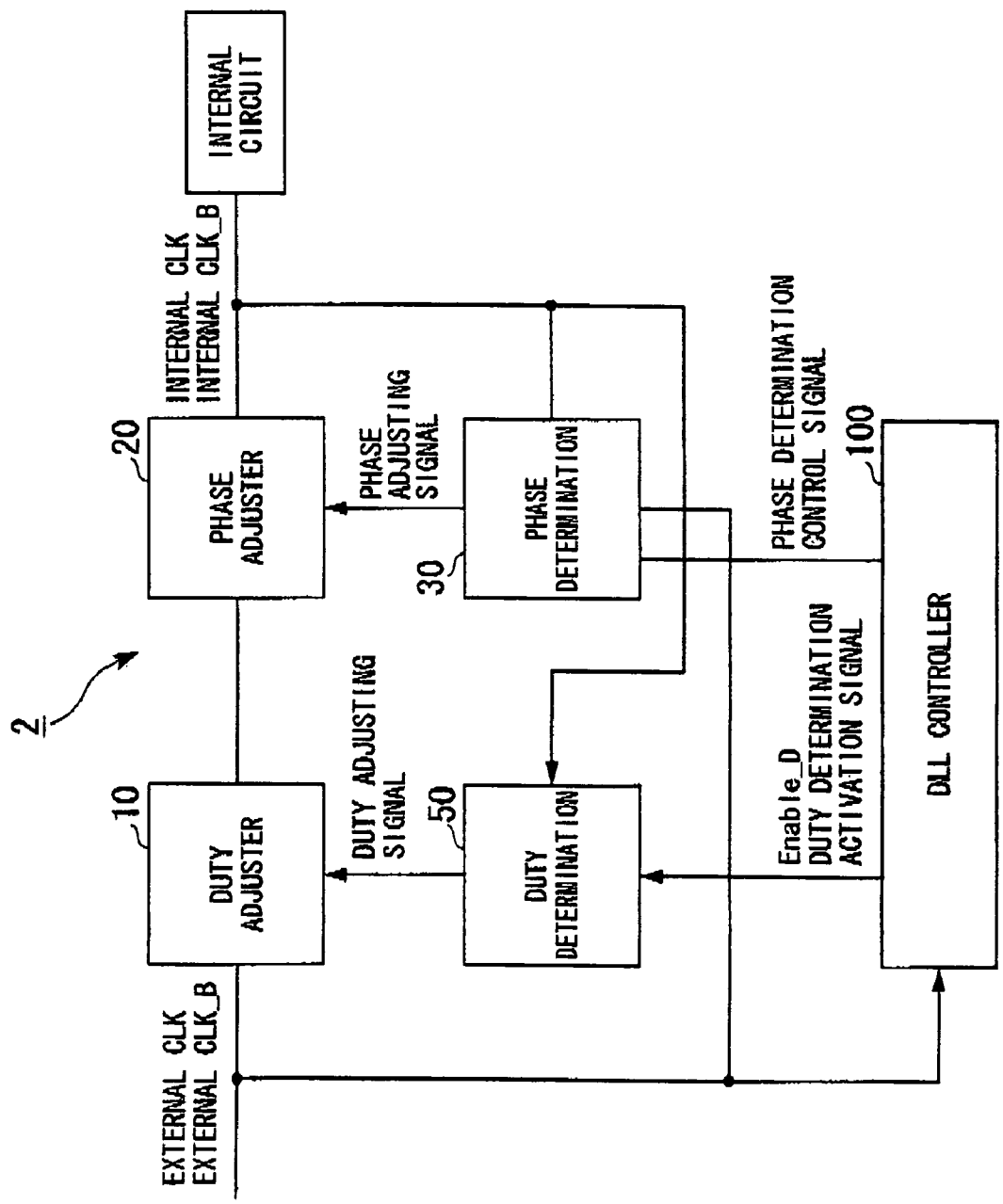
FIG. 5 is a block diagram illustrating the configuration of a delay clocked loop circuit in accordance with a second embodiment of the present invention.

FIG. 5 is a block diagram showing a configuration of a DLL (Delay Locked Loop) circuit having a duty detection circuit according to the second embodiment.

The DLL circuit 2 of FIG. 5 is different from the DLL circuit 1 of FIG. 1 in that the DLL control unit 100 shown in FIG. 1 supplies the counter update signal Update_C and the pre-charge signal PRE to the duty determination unit 40, whereas a DLL control unit 100 shown in FIG. 5 supplies a duty determination activation signal Enable_D to a duty determination unit 50.

Figure 6:
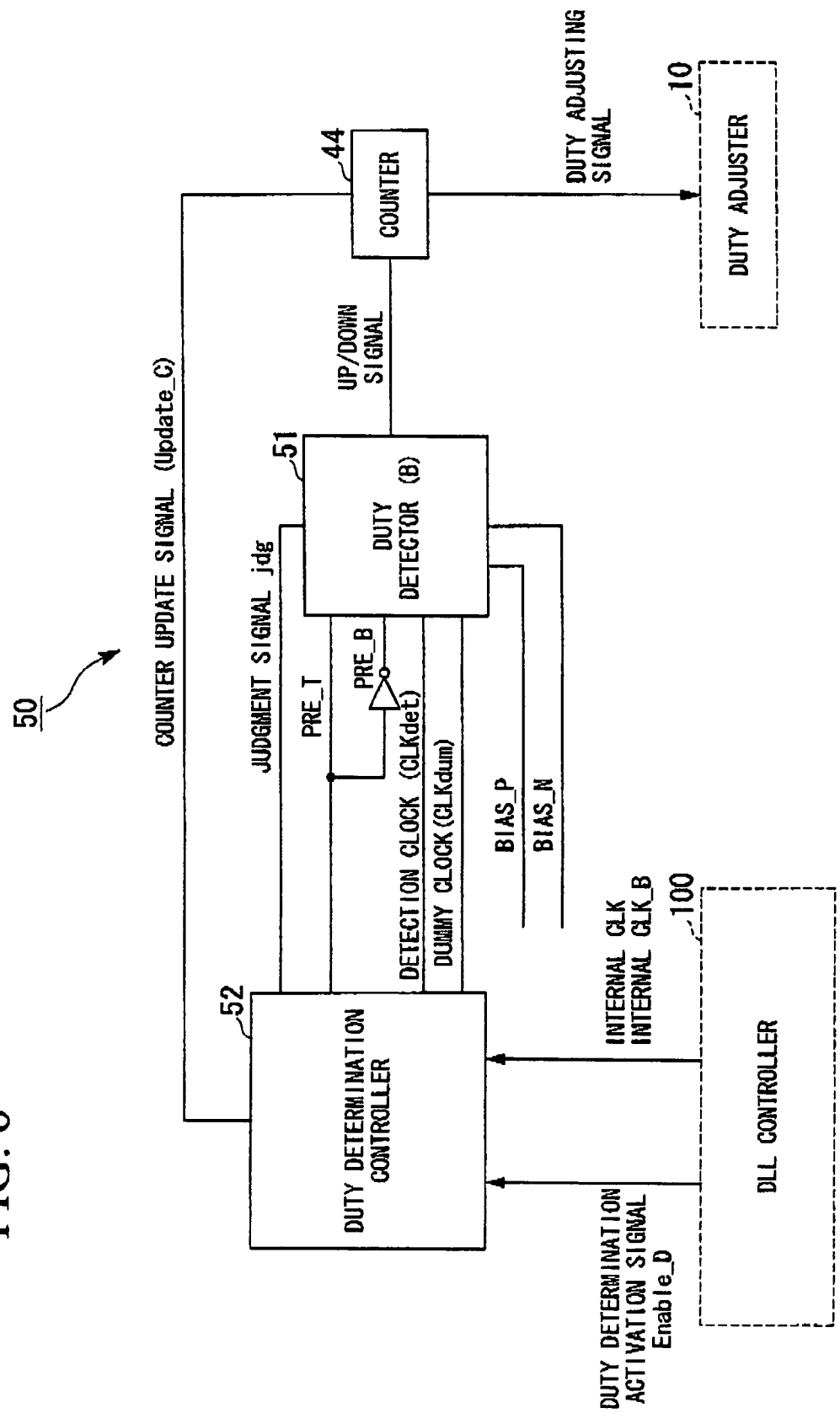
FIG. 6 is a block diagram illustrating the configuration of a duty determination unit included in the delay clocked loop circuit of FIG. 5.

FIG. 6 is a block diagram showing a configuration of the duty determination unit 50 according to the second embodiment. The duty determination unit 50 shown in FIG. 6 is different from the duty determination unit 40 according to the first embodiment shown in FIG. 2 in that a duty determination control circuit 52 shown in FIG. 6 is additionally provided.

The duty determination control circuit 52 receives the duty determination activation signal Enable_D and internal clock signals CLK and CLK_B from the DLL control unit 100, supplies a determination signal jdg, pre-charge signals PRE_T and PRE_B, a detection clock signal CLKdet and CLKdet_B, and dummy clock signals CLKdum and CLKdum_B synchronized with the internal clock signal CLK to a duty detection circuit (8) 51, and supplies a counter update signal Update_C synchronized with the internal clock signals CLK and CLK_B to a counter circuit 44.

The duty determination control circuit 52 outputs the pre-charge signals PRE_T and PRE_B, the detection clock signals CLKdet and CLKdet_B, the dummy clock signals CLKdum and CLKdum_B, and the counter update signal Update_C synchronized with the internal clock signals CLK and CLK_B as described later when the duty determination activation signal Enable_D is active.

In the duty detection circuit (B) 51 according to the second embodiment, in order to accurately control the timings of the end of the pre-charge operation and the start of the duty detection operation, it is necessary to control the pre-charge signals PRE_T and PRE_B in synchronism with the internal clock signal CLK. For this reason, it is necessary to provide the duty determination control circuit 52 that operates in synchronism with the internal clock signal CLK.

Figure 7:
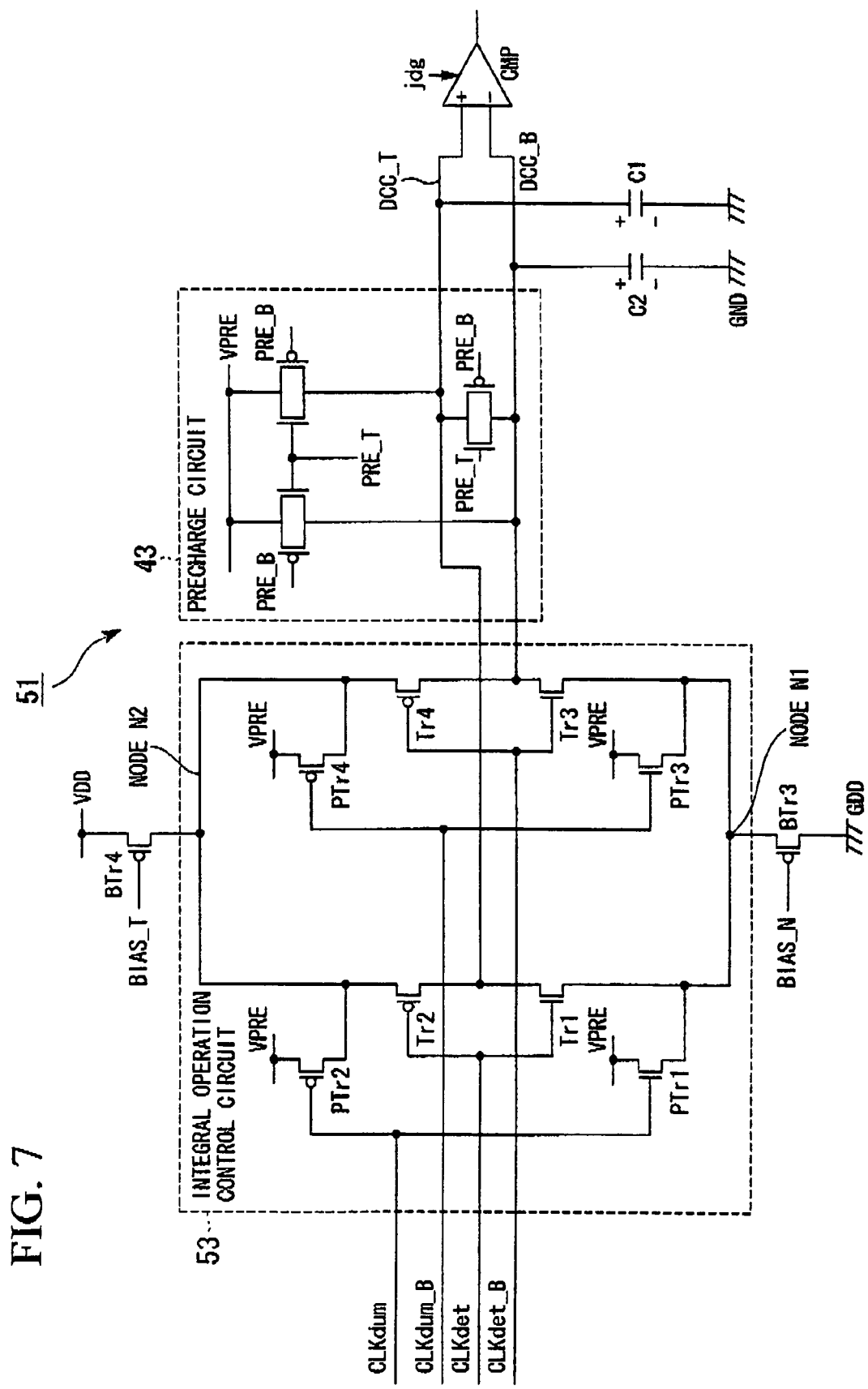
FIG. 7 is a circuit diagram illustrating a duty detection circuit included in the duty determination unit of FIG. 6.

FIG. 7 is a diagram showing a configuration of the duty detection circuit (B) 51 according to the second embodiment.

The duty detection circuit (B) 51 shown in FIG. 7 is different from the duty detection circuit (A) 41 according to the first embodiment shown in FIG. 3 in that the duty detection circuit (B) 51 shown in FIG. 7 uses the detection clock signals CLKdet and CLKdet_B in lieu of the internal clock signals CLK and CLK_B, integration circuit pre-charge transistors PTr1 to PTr4 are provided so as to pre-charge the nodes N1 and N2 during execution of the pre-charge operation, and bias transistors BTr3 and BTr4 are provided in lieu of the bias transistors BTr1 and BTr2. That is, the integration circuit pre-charge transistors PTr1 to PTr4 are additionally provided in an integration operation control circuit 53 shown in FIG. 7.

The control terminals (gate terminals) of the integration circuit pre-charge transistors PTr1 to PTr4 are supplied with the dummy clock signals CLKdum and CLKdum_B. The bias transistor BTr3 has higher current driving capability (the amount of bias current) than the bias transistor Bin according to the first embodiment shown in FIG. 3. The bias transistor BTr4 has higher current driving capability (the amount of bias current) than the bias transistor BTr2 according to the first embodiment shown in FIG. 3.

The comparison circuit CMP is supplied with the determination signal jdg from the duty determination control circuit 52 shown in FIG. 6. The comparison circuit CMP compares the potential difference between the signal line DCC_T and the DCC_B in response to an activation of the determination signal jdg and supplies the result of this comparison to the counter circuit 44 shown in FIG. 6.

Figure 8:
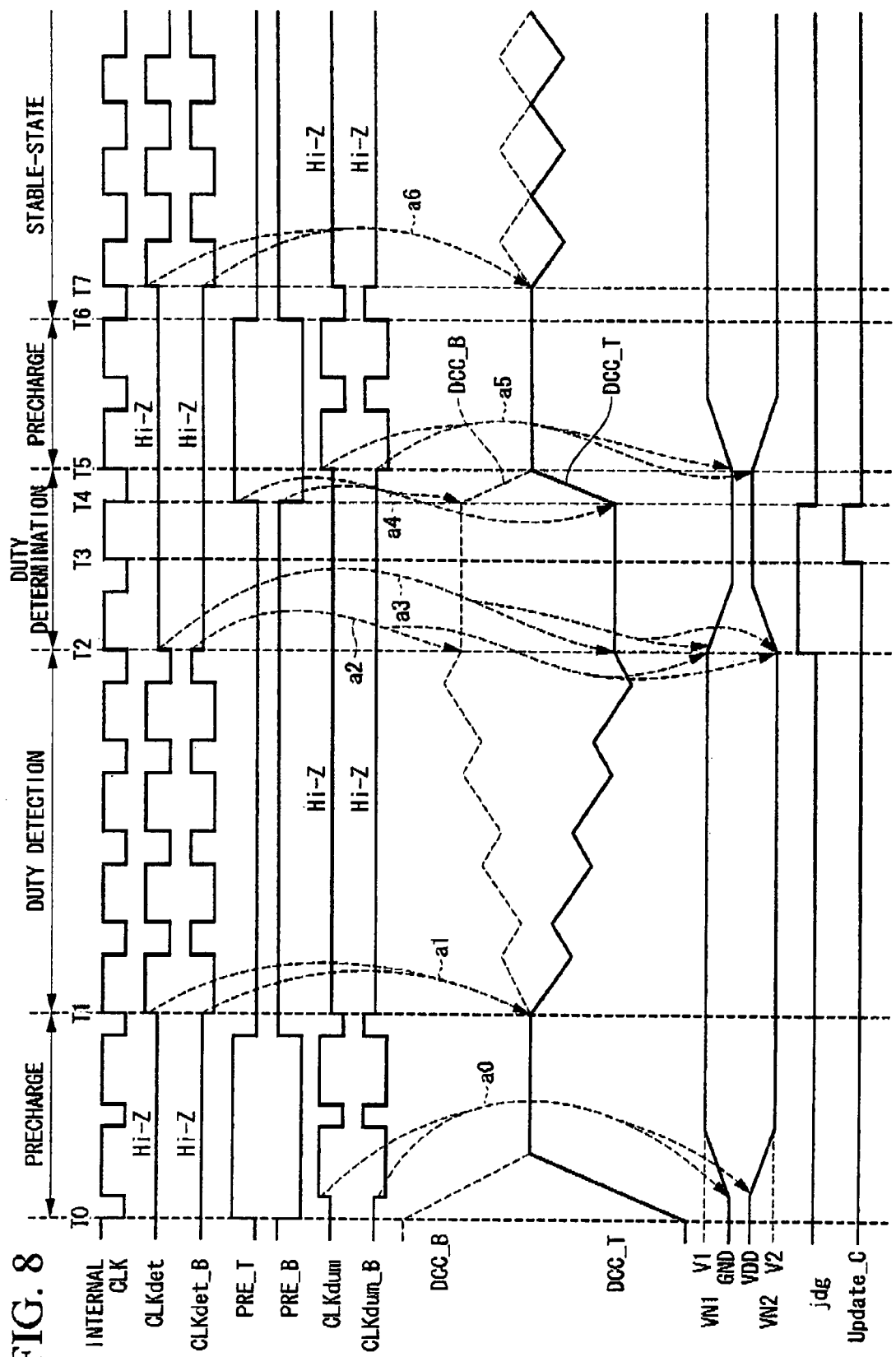
FIG. 8 is a timing chart illustrating waveforms showing operations of the duty detection circuit of FIG. 7.

FIG. 8 is a waveform diagram showing the duty detection operation and the duty determination operation according to the second embodiment.

The operation of the duty determination control circuit 52 will be described with reference to FIG. 8. Although not shown in FIG. 8, it is assumed that during the operation shown in FIG. 8, the duty determination activation signal Enable_D supplied from the DLL control unit 100 to the duty determination control circuit 52 is always at a high level which represents an active state.

At time T0, the duty determination control circuit 52 puts the pre-charge signals PRE_T and PRE_B into an active state and the dummy clock signals CLKdum and CLKdum_B into an active state and outputs these signals to the duty detection circuit (B) 51 in synchronism with the internal clock signal CLK.

Moreover, when the pre-charge signals PRE_T and PRE_B become inactive at time T1, the transfer gates TG1, TG2, and TG3 become non-conductive, and the pre-charge operation of the signal line DCC_T and the signal line DCC_B, namely the pre-charge operation of the capacitor C1 and the capacitor C2 ends.

The duty determination control circuit 52 outputs the detection clock signals CLKdet and CLKdet_B synchronized with the internal clock signals CLK and CLK_B to the duty detection circuit (B) 51 at time T1 in order to start the duty detection operation in the duty detection circuit (B) 51.

At time T2 occurring after the lapse of a predetermined duty detection period (four clocks in FIG. 8) from the start of supply of the detection clock signals CLKdet and CLKdet_B to the duty detection circuit (B) 51, the duty determination control circuit 52 puts the detection clock signals CLKdet and CLKdet_B into an inactive state (high-impedance state, Hi-Z) and puts the determination signal jdg into a high level which represents an active state in synchronism with a rising edge of the internal clock signal CLK.

At time T3 occurring after the lapse of a predetermined determination period from the point in time when the determination signal jdg is put into a high level, the duty determination control circuit 52 puts the counter update signal Update_C into a high level which represents an active state in synchronism with a rising edge of the internal clock signal CLK.

At time T4, the duty determination control circuit 52 puts the pre-charge signals PRE_T and PRE_B into an active state and puts the determination signal jdg and the counter update signal Update_C all into a low level which represents an inactive state in synchronism with a falling edge of the internal clock signal CLK. At time T5, the duty determination control circuit 52 puts the dummy clock signals CLKdum and CLKdum_B synchronized with the internal clock signal CLK into an active state and outputs these signals to the duty detection circuit (B) 51.

At time T6 occurring after the lapse of a predetermined pm-charge period (two clocks in FIG. 8) from the start of activation of the pre-charge signals PRE_T and PRE_B at time T5, the duty determination control circuit 52 puts the pre-charge signals PRE_T and PRE_B into inactive state in synchronism with the falling edge of the internal clock signal CLK.

At time T7, the duty determination control circuit 52 puts the detection clock signals CLKdet and CLKdet_B into an active state and puts the dummy clock signals CLKdum and CLKdum_B into high-impedance state (Hi-Z) which represents an inactive state, thus restarting the duty detection operation.

Next, the operation of the duty detection circuit (B) 51 will be described.

When the pre-charge signals PRE_T and PRE_B become active at time T0, the transfer gates TG1, TG2, and TG3 shown in FIG. 7 become conductive, and the pre-charge operation of the signal line DCC_T and the signal line DCC_B, namely the pre-charge operation of the capacitor C1 and the capacitor C2 is started.

Moreover, since the dummy clock signals CLKdum and CLKdum_B are active, the potentials of the nodes N1 and N2 are pre-charged towards a predetermined potential by the switching operations of the integration circuit pre-charge transistors PTr1 to PTr4 (see arrows a0). Here, it is preferable that the potential of the node N1 after the end of the pre-charge operation is the same as the potential (V1) of the node N1 during the execution of the duty detection operation in a normal state. Similarly, it is preferable that the potential of the node N2 after the end of the pre-charge operation is the same as the potential (V2) of the node N2 during the execution of the duty detection operation in a normal state.

After that, when the detection clock signals CLKdet and CLKdet_B become active at time T1, the charge/discharge operation of the capacitors C1 and C2 is started by the integration operation control circuit 53 (see arrows a1).

When the detection clock signals CLKdet and CLKdet_B become inactive at time T2, the charge/discharge operation of the capacitors C1 and C2 in the integration operation control circuit 53 stops, and the potentials of the signal lines DCC_T and DCC_B do not vary. Moreover, in response to an activation of the determination signal jdg, the comparison circuit CMP compares the potential difference between the signal lines DCC_T and DCC_B and outputs the comparison result to the counter circuit 44 as the Up/Down signal. Here, the comparison circuit CMP continues outputting the Up/Down signal during period when the determination signal jdg is high level.

Furthermore, since the detection clock signals CLKdet and CLKdet_B and the dummy clock signals CLKdum and CLKdum_B become inactive at time T2, the potential of the node N1 begins to change to GND and the potential of the node N2 begins to change to VDD (see arrows a2 and a3). However, since the charge/discharge operation of the capacitors C1 and C2 by the integration operation control circuit 53 is stopped at this point in time, the change in potentials of the nodes N1 and N2 will not affect the duty detection operation.

At time T3, in response to an activation of the counter update signal Update_C, the counter circuit 44 supplies a duty adjustment signal corresponding to the Up/Down signal supplied from the comparison circuit CMP to the duty adjustment unit 10 shown in FIG. 5.

At time T4, in response to an activation of the pre-charge signal, the potentials of the signal lines DCC_T and DCC_B (namely, the capacitors C1 and C2) are pre-charged towards a pre-charge potential (VDD/2 in FIG. 8) (see arrows a4).

At time T5, in response to an activation of the dummy clock signals CLKdum and CLKdum$_{13}$ B, the potentials of the nodes N1 and N2 are pre-charged to a predetermined potential (see arrows a5). Here, it is preferable that the potential of the node N1 after the end of the pre-charge operation is the same as the potential (V1) of the node N1 during the execution of the duty detection operation in a normal state. Similarly, it is preferable that the potential of the node N2 after the end of the pre-charge operation is the same as the potential (V2) of the node N2 during the execution of the duty detection operation in a normal state.

At time T7, in response to an activation of the detection clock signals CLKdet and CLKdet_B and an inactivation of the dummy clock signals CLKdum and CLKdum_B, the duty detection operation is started (see arrows a6).

As described above, in the second embodiment, for example, during the duty determination period (times T2 to T5), the potentials of the nodes N1 and N2 are changed from the potential (V1 or V2) during the execution of the duty detection operation in a normal state. However, since the potentials of the nodes N1 and N2 are pre-charged during the execution time (T5 to T6) of the pre-charge operation so that the potentials of the nodes N1 and N2 are pre-charged to V1 and V2, respectively, at the completion of the pre-charge operation, there will be no change in the charge/discharge rate of the charge/discharge operation in the integration operation control circuit 53 at the start (time T7) of the duty detection operation immediately after the pre-charge operation. For this reason, the charge/discharge rate of a capacitor immediately after the pre-charge operation will be approximately the same as the charge/discharge rate of a capacitor during the execution of a duty detection operation in a normal state. Therefore, in the duty detection circuit according to the embodiment, there is no unbalance between the charge/discharge rate of a capacitor immediately after the pre-charge operation and the charge/discharge rate of a capacitor during the execution of a duty detection operation in a normal state. As a result, it is possible to perform accurate duty measurement.

Although the second embodiment of the invention has been described, in the duty detection circuit (B) 51 shown in FIG. 7, the integration operation control circuit 53 corresponds to the first control circuit, the second control circuit corresponds to the DLL control unit 100, and the pre-charge circuit 43 corresponds to the integration initialization circuit. Moreover, the third bias transistor BTr3 or the fourth bias transistor BTr4 corresponds to the current circuit (or constant current circuit). Furthermore, the integration circuit pre-charge transistors PTr1 and PTr3 correspond to a first integration circuit pre-charge transistor, and the integration circuit pre-charge transistors PTr2 and PTr4 corresponds to a second integration circuit pre-charge transistor.

In addition, the duty detection circuit (B) 51 shown in FIG. 7 includes a memory unit (capacitors C1 and C2) that integrates the ratio of a first logic level (high level) period to a second logic level (low level) period of an input signal (CLKdet and CLKdet_B) and electrically stores the result of the integration as an integration result, a first control circuit (integration operation control circuit 53) that controls an integration operation of the memory unit in response to the input signal, a current circuit (bias transistors BTr3 and BTr4) which has one end connected to the first control circuit (integration operation control circuit 53) and the other end connected to a power line (VDD and GND), and an integration initialization circuit (pre-charge circuit 43) that initializes the integration result of the memory unit (capacitors C1 and C2).

In addition, the duty detection circuit (B) 51 further includes a first integration circuit pre-charge transistor (PTr1 and PTr3) which has a first primary electrode connected to the second power line (PRE) and a second primary electrode connected to one end of a constant current circuit (bias transistor BTr3), which electrically connects the second power line (PRE) to the constant current circuit (bias transistor BTr3) during execution of an integration initialization operation (pre-charge), and which electrically disconnects the second power line (PRE) from the constant current circuit (bias transistor BTr3) during non-execution of the integration initialization operation (pre-charge), and a second integration circuit pre-charge transistor (PTr2 and PTr4) which has a different conduction type from the first integration circuit pre-charge transistor (PTr1 and PTr3), and which has a first primary electrode connected to the second power line (PRE) and a second primary electrode connected to one end (node N2) of a current circuit (bias transistor BTr4). In this case, it is preferable that the current circuit (bias transistors BTr3 and BTr4) is configured by a constant current circuit.

With this configuration, the potentials of the contact points (nodes N1 and N2) between the integration control circuit (integration operation control circuit 53) and the constant current circuit (bias transistors BTr3 and BTr4) become approximately the same between the time during the initialization operation period (pre-charge period) and the time during the duty detection operation period. For this reason, in the duty detection circuit of the semiconductor device according to the embodiment, there is no unbalance between the charge/discharge rate of the capacitors immediately after the pre-charge operation and the charge/discharge rate of the capacitors during the execution of the duty detection operation in a normal state. As a result, it is possible to perform accurate duty measurement.

Third Embodiment

In the duty detection circuit (A) 41 according to the first embodiment, it is difficult to perform the duty detection in a short period of time as described above. On the other hand, although in the duty detection circuit (B) 51 described in the second embodiment, it is possible to perform duty measurement in a short period of time, since it is necessary to perform the operation of the duty determination unit in synchronism with the internal clock signal, the synchronization circuit (duty determination control circuit 52) is required, and thus power consumption increases.

However, in a DLL circuit having a duty adjustment circuit, there are a case where it is necessary to perform duty adjustment in a short period of time and a case where it is better to perform the duty adjustment in a relatively long period of time. Specifically, the former (a case where it is necessary to perform the duty adjustment in a short period of time) is a case where the DLL circuit starts from a non-operation state. In this case, a duty ratio of an internal clock signal before adjustment is greatly offset from a desired duty ratio range (for example, duty ratio of 50%), and it is necessary to adjust the duty ratio of the internal clock signal to a predetermined value within a limited period of time, namely a DLL lock period which is a period of time required for the DLL circuit to operate stably.

However, since there is a limitation in the amount of duty ratio which can be adjusted by one execution of the duty detection and duty adjustment operation, it is necessary to perform the duty detection and duty determination operation frequently during the start-up of the DLL circuit. Therefore, it is necessary to perform one execution of the duty detection operation in a short period of time during the start-up of the DLL circuit. On the other hand, the latter (a case where it is better to perform the duty adjustment in a relatively long period of time) is the case where the DLL circuit is in a normal operation state. In this case, since the offset of the duty ratio of the internal clock signal is smaller than that during the start-up of the DLL circuit, it is not necessary to perform the duty detection and duty determination operation frequently.

In view of the above, the duty determination unit 40 shown in the third embodiment performs the duty detection and duty determination operation using the duty detection circuit (B) 51 shown in the second embodiment in order to perform the duty detection and duty determination operation in a short period of time during the start-up of the DLL circuit and performs the duty detection and duty determination operation using the duty detection circuit (A) 41 shown in the first embodiment when the DLL circuit is in a normal operation state, thus stopping the operation of the duty determination control circuit during the normal operation of the DLL circuit and reducing power consumption.

Figure 9:
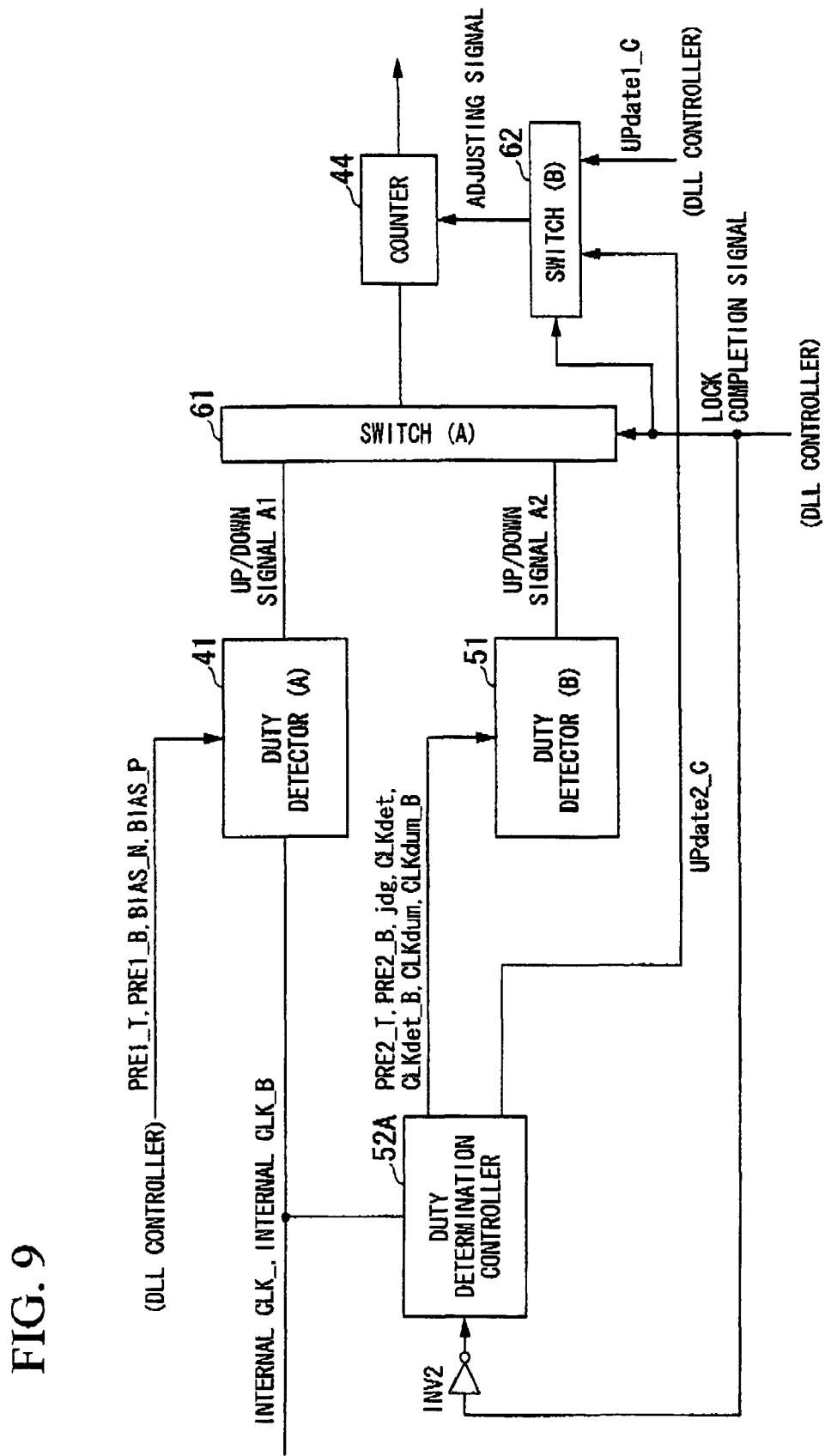
FIG. 9 is a block diagram illustrating the configuration of a duty determination unit included in a delay clocked loop circuit in accordance with a third embodiment of the present invention.

FIG. 9 is a block diagram showing a configuration of a duty determination unit according to the third embodiment of the invention.

A duty detection circuit (A) 41 shown in FIG. 9 uses pre-charge signals PRE1_T and PRE1_B in the control of a pre-charge operation in lieu of the pre-charge signals PRE_T and PRE_B used in the duty detection circuit (A) 41 according to the first embodiment shown in FIG. 2. The pre-charge signals PRE1_T and PRE1_B are supplied to the duty detection circuit (A) 41 from the DLL control unit 100 shown in FIG. 2 or 6.

A duty detection circuit (B) 51 shown in FIG. 9 uses pre-charge signals PRE2_T and PRE2_B in the control of the pre-charge operation in lieu of the pre-charge signals PRE_T and PRE_B used in the duty detection circuit (B) 51 according to the second embodiment shown in FIG. 6. The pre-charge signals PRE2_T and PRE2_B are supplied from a duty determination control circuit 52A via a synchronization circuit to the duty detection circuit (B) 51.

The bias transistor BTr1 shown in FIG. 3 which is provided in the duty detection circuit (A) 41 and is a constant current circuit that maintains the amount of electric charges being discharged from the integration operation control circuit 42 to the ground GND to be constant has different current driving capability from that of the bias transistor BTr3 shown in FIG. 7 which is provided in the duty detection circuit (B) 51 and is a constant current circuit that maintains the amount of electric charges being discharged from the integration operation control circuit 53 to the ground GND to be constant. Specifically, the current driving capability (the amount of bias current) of the bias transistor BTr3 is set to be larger than the current driving capability of the bias transistor BTr1.

The bias transistor BTr2 shown in FIG. 3 which is provided in the duty detection circuit (A) 41 and is a constant current circuit that maintains the amount of current being supplied from the power source VDD to the integration operation control circuit 42 to be constant has different current driving capability from that of the bias transistor BTr4 shown in FIG. 7 which is provided in the duty detection circuit (B) 51 and is a constant current circuit that maintains the amount of current being supplied from the power source VDD to the integration operation control circuit 53 to be constant. Specifically, the current driving capability (the amount of bias current) of the bias transistor BTr4 is set to be larger than the current driving capability of the bias transistor BTr2.

A switch (A) 61 is a circuit which is controlled by a lock completion signal supplied from the DLL control unit 100 and outputs either one of an Up/Down signal A1 supplied from the duty detection circuit (A) 41 and an Up/Down signal A2 supplied from the duty detection circuit (B) 51 to the counter circuit 44 as an Up/Down signal based on the state of the lock completion signal. Specifically, the Up/Down signal A2 is selected when the lock completion signal is inactive (representing a lock incomplete state), and the Up/Down signal A1 is selected when the lock completion signal is active (representing a lock complete state).

A switch (B) 62 is a circuit which is controlled by the lock completion signal supplied from the DLL control unit 100 and outputs either one of a counter update signal Update1_C supplied from the DLL control unit 100 and a counter update signal Update2_C supplied from the duty determination control circuit 52A to the counter circuit 44 as a counter update signal Update_C based on the state of the lock completion signal. Specifically, the counter update signal Update2_C is selected when the lock completion signal is inactive (representing that the DLL circuit is being started up), and the counter update signal Update1_C is selected when the lock completion signal is active (representing that the DLL circuit is in a normal operation state).

The duty determination control circuit 52A is different from the duty determination control circuit 52 according to the second embodiment shown in FIG. 6 in that the lock completion signal supplied from the DLL control unit 100 is supplied in opposite phases via an inverter INV2 in lieu of the duty determination activation signal supplied from the DLL control unit 100. The duty determination control circuit 52A becomes active when the lock completion signal is inactive and becomes inactive (halt state) when the lock completion signal is active.

By configuring the duty determination unit of the DLL circuit to have such a configuration as shown in FIG. 9, in the third embodiment, it is possible to perform the duty adjustment operation in a short period of time using the duty detection circuit (B) 51 during the start-up period (DLL lock period) of the DLL circuit. Moreover, by performing the duty detection operation using the duty detection circuit (A) 41 after the start-up operation of the DLL circuit is complete (during a normal operation), it is possible to stop the synchronization circuit in which power consumption is large, thus reducing the power consumption during the normal operation of the DLL circuit.

Figure 10:
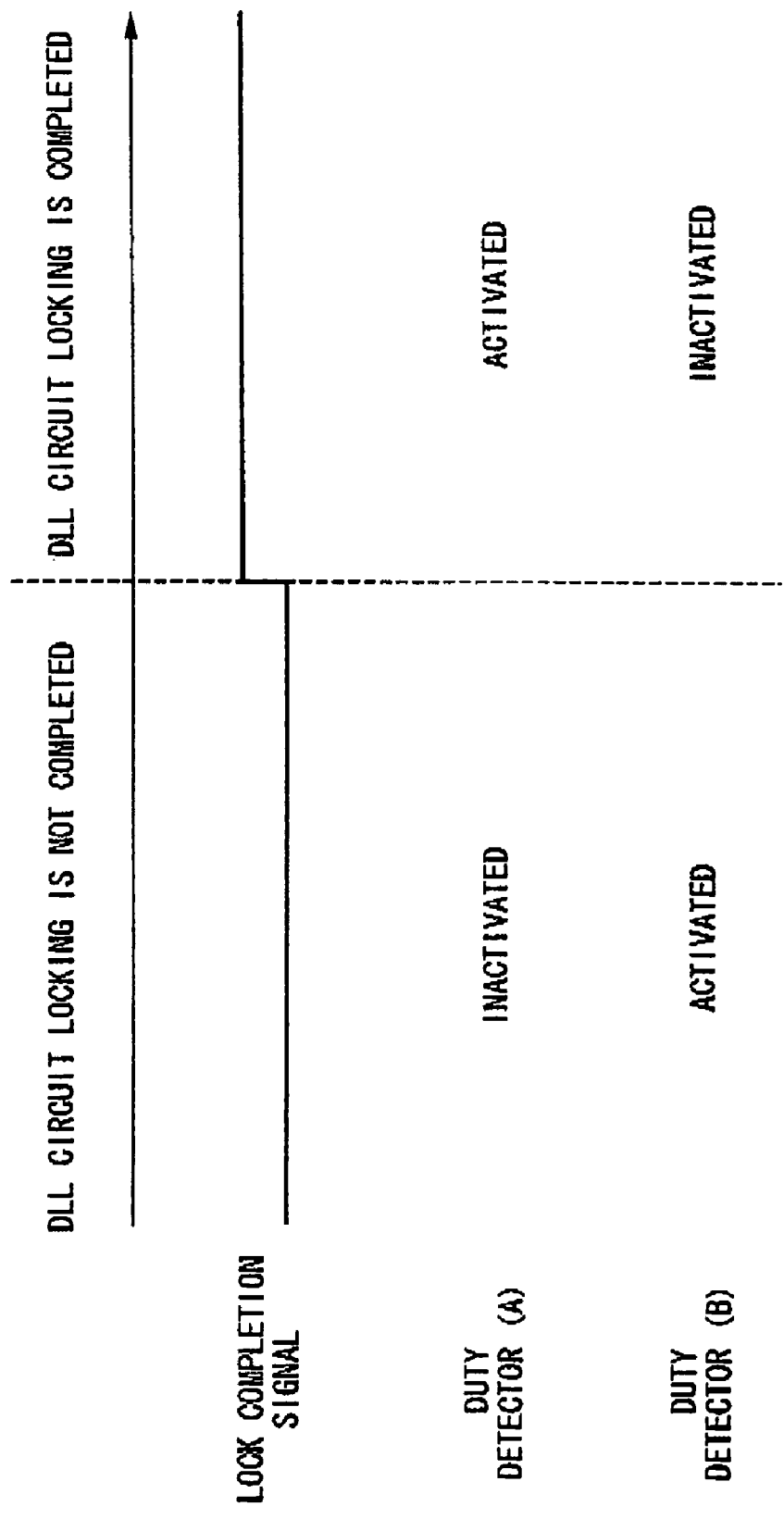
FIG. 10 is a timing chart illustrating switching timings of a duty detection circuit included in a duty determination unit of FIG. 9.

FIG. 10 is a waveform diagram showing a switching timing of the duty detection circuit of the DLL circuit according to the third embodiment (for detailed operations of the duty detection circuit (A) 41 and the duty detection circuit (B) 51, reference should be made to FIGS. 4 and 8).

As shown in FIG. 10, during period when the DLL circuit is being locked (when the lock completion signal is inactive), the duty detection circuit (A) 41 is inactive, and the duty detection circuit (B) 52 is active, so that the duty detection and duty determination operation is performed by the duty detection circuit (B) 52. Moreover, after the DLL circuit is locked (when the lock completion signal is active), the duty detection circuit (A) 41 is active, and the duty detection circuit (B) 52 is inactive, so that the duty detection and duty determination operation is performed by the duty detection circuit (A) 41.

Although in the third embodiment, the switching timing of the duty detection circuit occurs between time when the DLL circuit is not locked yet and time when the DLL circuit is completely locked, the switching timing is not limited to this. For example, coarse adjustment of a duty ratio immediately after the start-up of the DLL circuit may be performed using the duty detection circuit (B) 51 during the lock period of the DLL circuit, and fine adjustment of the duty ratio immediately before lock completion may be performed using the duty detection circuit (A) 41 during the lock period of the DLL circuit.

Although the third embodiment of the invention has been described, in the duty determination unit shown in FIG. 9, the duty detection circuit (A) 41 corresponds to the first duty detection circuit, the capacitors C1 and C2 in the duty detection circuit (A) 41 correspond to the first memory unit, the integration operation control circuit 42 corresponds to the first integration control circuit, the bias transistors (BTr1 and BTr2) correspond to the first current circuit, and the pre-charge circuit 43 corresponds to the first integration initialization circuit (see FIG. 3). Moreover, the duty detection circuit (B) 51 corresponds to the second duty detection circuit, the capacitors C1 and C2 in the duty detection circuit (B) 51 correspond to the second memory unit, the integration operation control circuit 53 corresponds to the second integration control circuit, the bias transistors (BTr3 and BTr4) correspond to the second current circuit, and the pre-charge circuit 43 corresponds to the second integration initialization circuit (see FIG. 7). Furthermore, the integration result by the first integration control circuit (integration operation control circuit 42) in the first duty detection circuit corresponds to the first integration result, and the integration result by the second integration control circuit (integration operation control circuit 53) in the second duty detection circuit corresponds to the second integration result.

In a semiconductor device having a DLL circuit which includes the first duty detection circuit (A) 41, the second duty detection circuit (B) 51, and the duty adjustment unit 10 shown in FIG. 9, the first duty detection circuit (A) 41 includes a first memory unit that integrates the ratio of a first logic level (high level) period to a second logic level (low level) period of an input signal and electrically stores the result of the integration as a first integration result, a first integration control circuit (integration operation control circuit 42) that controls an integration operation of the first memory unit in response to the input signal, a first current circuit (bias transistors BTr1 and BTr2) which has one end connected to the first integration control circuit (integration operation control circuit 42) and the other end connected to a power line (VDD and GM), and a first integration initialization circuit (pre-charge circuit) that initializes the integration value in the first memory unit, in which the integration operation by the first integration control circuit (integration operation control circuit 42) is continued during the integration initialization operation of the first memory unit by the first integration initialization circuit (pre-charge circuit).

In addition, the second duty detection circuit (B) 51 includes a second memory unit that integrates the ratio of a first logic level (high level) period to a second logic level (low level) period of an input signal and electrically stores the result of the integration as a second integration result, a second integration control circuit (integration operation control circuit 53) that controls an integration operation of the second memory unit in response to the input signal, a second current circuit (bias transistors BTr3 and BTr4) which has one end connected to the second integration control circuit (integration operation control circuit 53) and the other end connected to a power line (VDD and GND), and a second integration initialization circuit (pre-charge circuit) that supplies an initialization potential (PRE) to the second memory unit so as to initialize the second integration result in the second memory unit. During the integration initialization operation of the second memory unit by the second integration initialization circuit (pre-charge circuit), the second duty detection circuit (B) 51 stops the integration operation by the second integration control circuit (integration operation control circuit 53) and supplies the initialization potential (PRE) to one end (node N1 or N2) of the second current circuit (bias transistors BTr3 and BTr4). The duty adjustment unit 10 adjusts the ratio of the first logic level period to the second logic level period of the input signal based on the first integration result or the second integration result. In this case, it is preferable that the first current circuit (bias transistors BTr1 and BTr2) and the second current circuit (bias transistors BTr3 and BTr4) are configured by a constant current circuit. Moreover, the amount of current flowing through the second constant current circuit (bias transistors BTr3 and BTr4) is configured to be larger than the amount of current flowing through the first constant current circuit (bias transistors BTr1 and BTr2).

Furthermore, the semiconductor device further includes the switch 61 which receives the first integration result in the first integration control circuit (integration operation control circuit 42) and the second integration result in the second integration control circuit (integration operation control circuit 53) and outputs either one of the first integration result and the second integration result to the duty adjustment unit 10. The switch 61 outputs the second integration result to the duty adjustment unit 10 during a first period when the DLL circuit is started up from a non-operation state and is not yet operating stably and outputs the first integration result to the duty adjustment unit 10 during a second period when the DLL circuit operates stably.

It is apparent that the present invention is not limited to the above embodiments, but may be modified and changed without departing from the scope and spirit of the invention.

What is claimed is:

1. A device comprising:
a first capacitor coupled to a first node;
a first current source coupled to a second node;
a first switch coupled between the first and second nodes;
a voltage line;
a second switch coupled between the voltage line and the first node;
a third switch coupled between the voltage line and the second node, the third switch being rendered conductive while the second switch is in a conductive state;
a second current source coupled to a third node;
a fourth switch coupled between the first and the third nodes; and
a fifth switch coupled between the voltage line and the third node, the fifth switch being rendered conductive while the second switch is in the conductive state.

2. The device as claimed in claim 1, wherein the first switch is in a non-conductive state while the second switch is in the conductive state.

3. The device as claimed in claim 1, wherein the first and the fourth switches are configured to be complementally conductive to each other.

4. The device as claimed in claim 1, further comprising:
a second capacitor coupled to the third node, wherein the first and the fourth switches are configured to be complementally conductive to each other.

5. A device comprising:
a first capacitor coupled to a first node;
a first current source coupled to a second node;
a first switch coupled between the first and second nodes, the first switch receiving a first clock signal at a control terminal thereof;
a voltage line;
a second switch coupled between the voltage line and the first node;
a third switch coupled between the voltage line and the second node, the third switch receiving a second clock signal at a control terminal thereof; and
a control circuit coupled to the control terminals of the first and third switches and providing the second clock signal for the control terminal of the third switch in a first period of time when being rendered conductive while the second switch is in a conductive state, and stopping providing the second clock signal for the control terminal of the third switch at least during a second period of time when the control circuit providing the first clock signal for the control terminal of the first switch.

6. The device as claimed in claim 5, wherein the control circuit stops providing the first clock signal during the first period of time.

7. The device as claimed in claim 5, further comprising;
a second current source coupled to a third node,
a fourth switch coupled between the first and the third nodes, the fourth switch receiving the first clock signal at a control terminal thereof; and
a fifth switch coupled between the voltage line and the third node, the fifth switch receiving the second clock signal at a control node thereof.

8. The device as claimed in claim 7, wherein the first and the fourth switches are configured to be complementally conductive to each other.

9. The device as claimed in claim 5, further comprising:
a second capacitor coupled to a third node; and
a fourth switch coupled between the second and the fourth nodes,
wherein the first and the fourth switches are configured to be complementally conductive to each other.

* * * * *